(12) United States Patent
Kimura

(10) Patent No.: US 8,149,346 B2
(45) Date of Patent: Apr. 3, 2012

(54) DISPLAY DEVICE AND MANUFACTURING METHOD THEREOF

(75) Inventor: Hajime Kimura, Kanagawa (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 929 days.

(21) Appl. No.: 11/548,097

(22) Filed: Oct. 10, 2006

(65) Prior Publication Data

US 2007/0139571 A1    Jun. 21, 2007

(30) Foreign Application Priority Data

Oct. 14, 2005   (JP) ................... 2005-301022

(51) Int. Cl.
  *G02F 1/136* (2006.01)
(52) U.S. Cl. ........................... 349/43; 349/46
(58) Field of Classification Search .................. None
  See application file for complete search history.

(56) References Cited

U.S. PATENT DOCUMENTS

| | | | |
|---|---|---|---|
| 6,195,140 B1 | 2/2001 | Kubo et al. | |
| 6,295,109 B1 | 9/2001 | Kubo et al. | |
| 6,330,047 B1 | 12/2001 | Kubo et al. | |
| 6,452,654 B2 * | 9/2002 | Kubo et al. | 349/114 |
| 6,468,840 B2 | 10/2002 | Tanaka et al. | |
| 6,730,970 B1 * | 5/2004 | Katoh et al. | 257/365 |
| 6,800,872 B2 | 10/2004 | Tanaka et al. | |
| 6,819,379 B2 | 11/2004 | Kubo et al. | |
| 6,850,292 B1 * | 2/2005 | Murade | 349/44 |
| 6,887,744 B2 | 5/2005 | Hotta | |
| 6,950,159 B2 | 9/2005 | Kubo et al. | |
| 6,958,490 B2 | 10/2005 | Okamoto et al. | |
| 6,980,268 B2 | 12/2005 | You | |
| 7,023,508 B2 | 4/2006 | You | |
| 7,151,581 B2 | 12/2006 | Kubo et al. | |
| 7,274,420 B2 | 9/2007 | You | |
| 7,436,464 B2 | 10/2008 | Okada et al. | |
| 7,468,527 B2 | 12/2008 | Ahn | |
| 7,468,768 B2 | 12/2008 | Kubo et al. | |
| 7,524,593 B2 | 4/2009 | Ohnuma | |

(Continued)

FOREIGN PATENT DOCUMENTS

CN        1702531 A    11/2005

(Continued)

OTHER PUBLICATIONS

Yong In Park et al.; "P-168: LTPS PMOS Four-Mask Process for AMLCDs"; *SID '05 Digest*; pp. 341-343; 2005.

(Continued)

*Primary Examiner* — Tina Wong
(74) *Attorney, Agent, or Firm* — Fish & Richardson P.C.

(57) ABSTRACT

It is an object of the present invention to form a pixel electrode and a metal film using one resist mask in manufacturing a stacked structure by forming the metal film over the pixel electrode. A conductive film to be a pixel electrode and a metal film are stacked. A resist pattern having a thick region and a region thinner than the thick region is formed over the metal film using an exposure mask having a semi light-transmitting portion. The pixel electrode, and the metal film formed over part of the pixel electrode to be in contact therewith are formed using the resist pattern. Accordingly, a pixel electrode and a metal film can be formed using one resist mask.

14 Claims, 21 Drawing Sheets

U.S. PATENT DOCUMENTS

| | | |
|---|---|---|
| 7,535,528 B2 | 5/2009 | Kubo et al. |
| 7,550,183 B2 | 6/2009 | Ishizuka et al. |
| 7,554,128 B2 | 6/2009 | Okamoto et al. |
| 7,626,669 B2 | 12/2009 | Lim et al. |
| 7,652,735 B2 | 1/2010 | You |
| 7,663,717 B2 | 2/2010 | Kubo et al. |
| 7,903,209 B2 | 3/2011 | You |
| 7,952,667 B2 | 5/2011 | Kubo et al. |
| 2001/0015778 A1* | 8/2001 | Murade et al. ............ 349/43 |
| 2002/0025591 A1 | 2/2002 | Ohnuma et al. |
| 2003/0142253 A1* | 7/2003 | Takenaka ............... 349/113 |
| 2003/0153110 A1 | 8/2003 | Hotta et al. |
| 2006/0014335 A1 | 1/2006 | Ohnuma et al. |
| 2006/0044487 A1* | 3/2006 | Okada et al. ............ 349/46 |
| 2006/0275710 A1 | 12/2006 | Yamazaki et al. |
| 2006/0278875 A1 | 12/2006 | Ohnuma et al. |
| 2006/0292865 A1 | 12/2006 | Yamazaki et al. |
| 2007/0001225 A1 | 1/2007 | Ohnuma et al. |
| 2007/0023790 A1 | 2/2007 | Ohnuma et al. |
| 2007/0037069 A1 | 2/2007 | Ohnuma |
| 2007/0037070 A1 | 2/2007 | Ohnuma et al. |
| 2007/0037311 A1 | 2/2007 | Izumi et al. |
| 2007/0146592 A1 | 6/2007 | Kimura |
| 2009/0085040 A1 | 4/2009 | Ahn |
| 2009/0275155 A1 | 11/2009 | Lim et al. |
| 2010/0201928 A1 | 8/2010 | Kubo et al. |

FOREIGN PATENT DOCUMENTS

| | | |
|---|---|---|
| JP | 06-230425 | 8/1994 |
| JP | 11101992 A | 4/1999 |
| JP | 11109417 A | 4/1999 |
| JP | 11281972 A | 10/1999 |
| JP | 2000019563 A | 1/2000 |
| JP | 2001326360 A | 11/2001 |
| JP | 2003140191 A | 5/2003 |
| JP | 2003188385 A | 7/2003 |
| JP | 2004214010 A | 7/2004 |
| JP | 2005316399 A | 11/2005 |
| JP | 2006071946 A | 3/2006 |
| JP | 2006163356 A | 6/2006 |

OTHER PUBLICATIONS

J.Y. Yang et al.; "27.1: A Novel Structure of AMLCD Panel Using Poly-Si CMOS TFT"; *SID '05 Digest*; pp. 1149-1151; 2005.

Office Action issued in Chinese Application No. 200610135937.5, dated Mar. 2, 2010, and translation, 19 pages.

\* cited by examiner

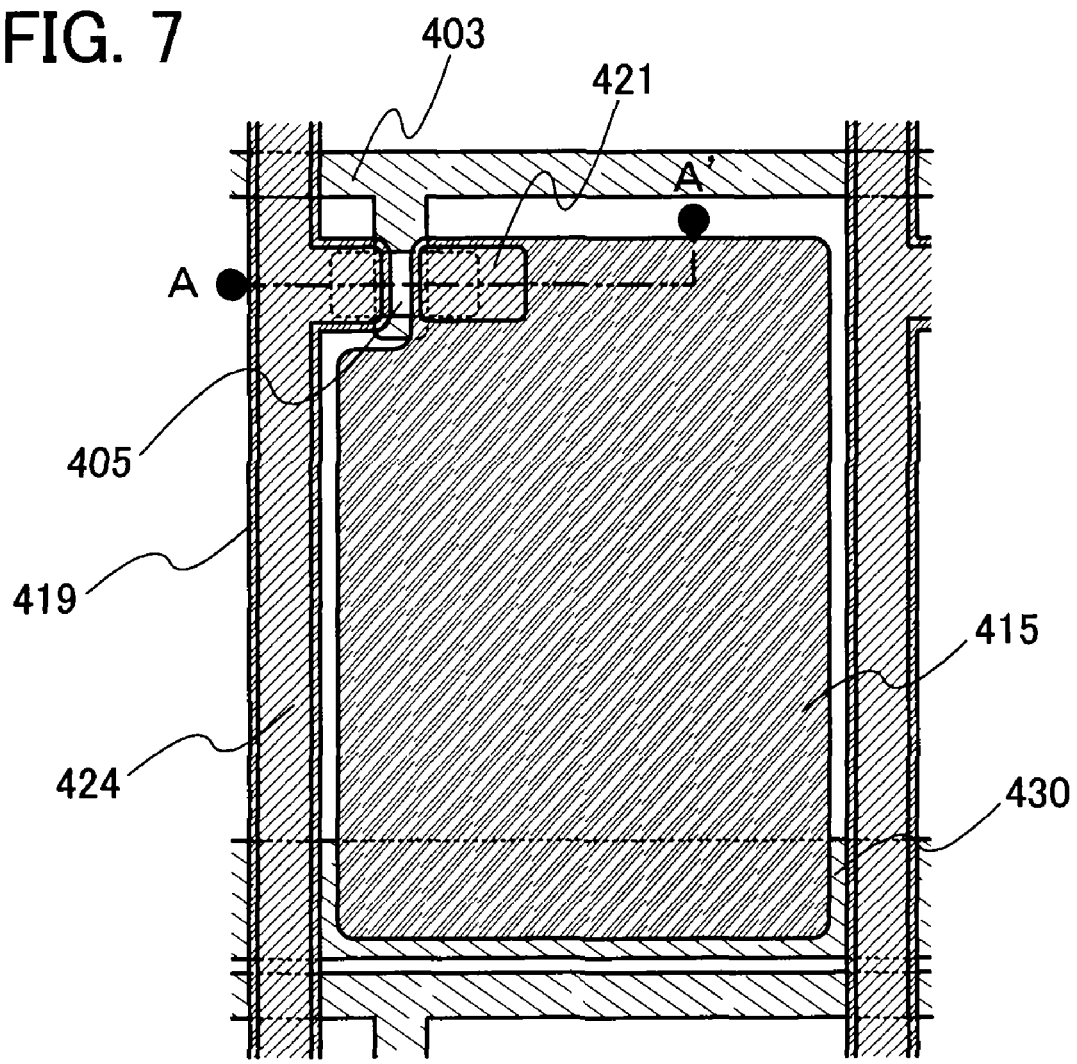

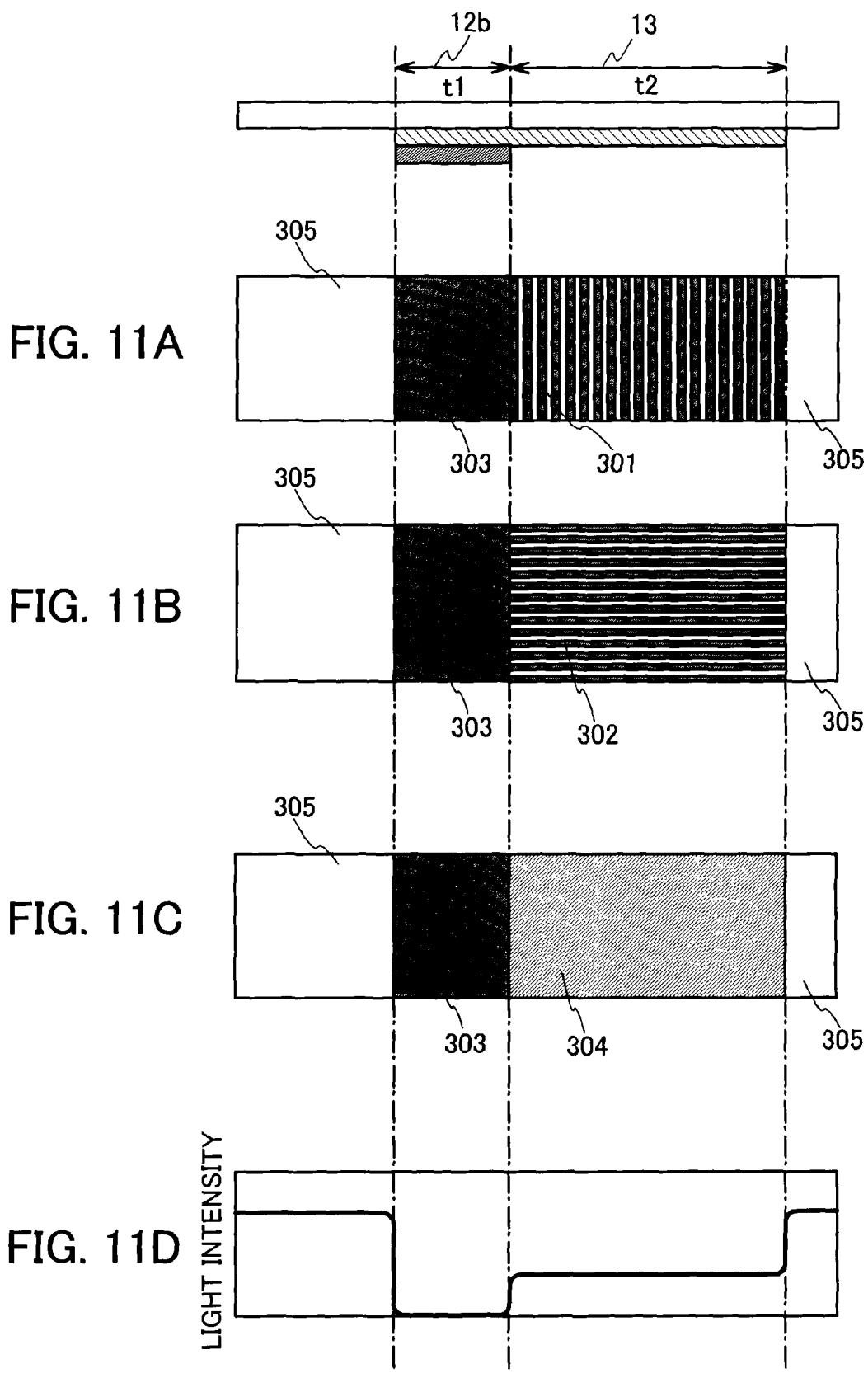

DISPLAY DEVICE AND MANUFACTURING METHOD THEREOF

BACKGROUND OF THE INVENTION

1. Field of the Invention

The present invention relates to a semiconductor device having a pixel electrode, especially a display device.

2. Description of the Related Art

In manufacturing an active matrix display device, in general, a wiring to be connected to a semiconductor film of a thin film transistor (TFT) is formed and a conductive film to be a pixel electrode is formed over the wiring. Therefore, a resist mask for forming the wiring and a resist mask for forming the pixel electrode have been required.

Further, as another example, an example is given, in which a conductive film to be connected to a semiconductor film of a TFT is formed, the conductive film is made to serve also as a pixel electrode, and a metal film is formed over the conductive film (for example, Patent Document 1: Japanese Published Patent Application No. Hei6-230425). This example is different from the example described above. A transparent conductive film is employed as the conductive film, and the transparent conductive film is directly connected to the semiconductor film. The transparent conductive film is formed from a material having high resistance in many cases; therefore, in order to cover high electric resistance of the transparent conductive film, the metal film is formed over the transparent conductive film.

Also in Patent Document 1, in which the transparent conductive film is directly connected to the semiconductor film, a resist mask for forming a pixel electrode by etching the transparent conductive film and a resist mask for etching the metal film have been required.

In a conventional active matrix display device, a resist mask has been required for each layer in forming a stacked wiring. In particular, there are a number of stacked structures in forming a pixel electrode, and at least a resist mask for forming the pixel electrode and a resist mask for etching a film to be stacked over the pixel electrode are required. Thus, there have been a number of manufacturing steps. Therefore, a manufacturing cost of a semiconductor device like a display device has not been lowered.

SUMMARY OF THE INVENTION

In view of the foregoing problem, it is an object of the present invention to shorten a manufacturing process by forming a pixel electrode and a film to be stacked over the pixel electrode using one resist mask.

One feature of the present invention is to have a thin film transistor over a substrate, a pixel electrode electrically connected to the thin film transistor, and a metal film formed over the pixel electrode, where the metal film is in contact with the pixel electrode so as to cover a level difference portion of the pixel electrode.

According to this structure, disconnection of a pixel electrode in a level difference portion can be prevented. Disconnection refers that, by forming a film over a surface having a level difference portion, a crack is generated in the film in the level difference portion or part of the film is not formed owing to unfavorable coverage of the film in the level difference portion.

Another feature of the present invention is to have a thin film transistor over a substrate, a pixel electrode electrically connected to the thin film transistor, and a metal film formed over the pixel electrode to be in contact therewith, where the metal film has a smaller plane-surface area than the pixel electrode, a side of the metal film is along a side of the pixel electrode, and the side of the metal film is located inside the side of the pixel electrode.

According to this structure, the metal film can be used as part of a light-shielding film, and alignment of the light-shielding film can be easily conducted.

One feature of the present invention is a display device having a thin film transistor over a substrate, a pixel electrode electrically connected to the thin film transistor, a metal film over part of the pixel electrode to be in contact therewith, a partition wall, which is formed over the pixel electrode and the metal film, and that makes part of the pixel electrode be exposed, an electroluminescent layer formed to be in contact with the partition wall and the pixel electrode, and an electrode over the electroluminescent layer, where at least one side of the metal film is inclined and covered with the partition wall.

According to this structure, short-circuit of a light emitting element can be prevented in an electroluminescent display device.

A pixel electrode and a metal film formed over part of the pixel electrode to be in contact therewith can be formed using one resist pattern. Two patterns of the pixel electrode and the metal film can be formed using one resist pattern; therefore, a manufacturing process can be shortened, and accordingly, a low-cost display device can be realized.

According to the present invention, the number of manufacturing steps can be decreased more than before, and a manufacturing cost of a semiconductor device can be lowered. In addition, disconnection of a pixel electrode in a level difference portion can be prevented because a metal film is formed over the pixel electrode to be in contact therewith. An inexpensive and highly reliable display device with less display failure can be formed.

BRIEF DESCRIPTION OF THE DRAWING

In the accompanying drawings:

FIG. 7 is a top view of a semiconductor device (Embodiment Mode 2);

FIGS. 11A to 11D are top views and a view showing light intensity distribution of an exposure mask (Embodiment Mode 3);

DETAILED DESCRIPTION OF THE INVENTION

Figure 1A:
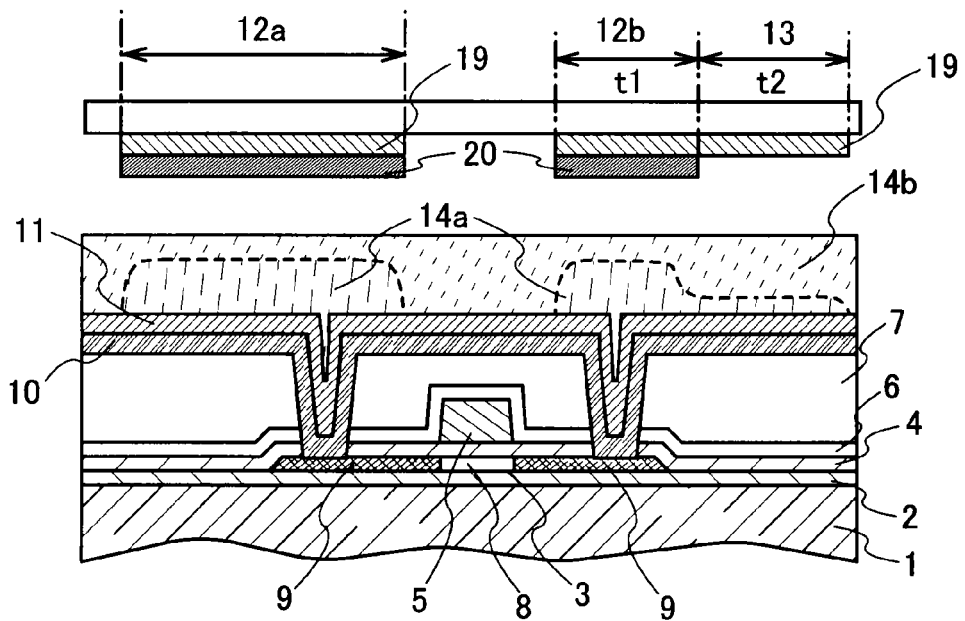
FIGS. 1A to 1C are cross-sectional views each showing a manufacturing process of a semiconductor device (Embodiment Mode 1)

Hereinafter, embodiment modes according to the present invention will be described. However, the present invention can be implemented in various embodiments within the range of enablement, and it is easily understood by those skilled in the art that various changes and modifications will be apparent to those skilled in the art. Therefore, unless such changes and modifications depart from the scope of the invention, they should be construed as being included therein. In addition, embodiment modes shown below can be appropriately combined.

Embodiment Mode 1

In this embodiment mode, a method for forming a top-gate TFT over a substrate 1 will be explained with reference to FIGS. 1A to 1C. The substrate 1 is a substrate having a light-transmitting property, for example, a quartz substrate, a glass substrate, or a plastic substrate. It is to be noted that the substrate 1 may be a substrate having a light-shielding property, and a semiconductor substrate or an SOI (Silicon on Insulator) substrate may be used.

An insulating film 2 is formed as a base film over the substrate 1. As the insulating film 2, a single layer of an insulating film such as a silicon oxide film, a silicon nitride film, or a silicon oxynitride film ($SiO_xN_y$), or a stack formed of at least two films of these films is used. Then, an island-like semiconductor film 3 is formed over the insulating film 2.

The island-like semiconductor film 3 is formed in the following manner: a semiconductor film is formed over the entire surface of the insulating film 2 by a sputtering method, an LPCVD method, a plasma CVD method, or the like, then, a shape of the semiconductor film is processed using a mask formed by a photolithography method or the like. When the island-like semiconductor film 3 is formed of a crystalline semiconductor film, there are a method for forming a crystalline semiconductor film directly over the substrate 1 and a method for forming a crystalline semiconductor film by crystallizing an amorphous semiconductor film by heat treatment after forming the amorphous semiconductor film over the substrate 1. In the latter method, heat treatment in crystallization is conducted by a heating furnace, laser irradiation, or irradiation of light emitted from a lamp instead of laser light (hereinafter, referred to as lamp annealing), or a combination thereof.

In addition, the crystalline semiconductor film may be formed by a thermal crystallization method conducting the above heat treatment after doping the amorphous semiconductor film with nickel or the like. It is to be noted that, in a case of obtaining the crystalline semiconductor film by crystallization using a thermal crystallization method with the use of nickel, gettering treatment by which nickel is removed after crystallization is preferably conducted.

In a case of manufacturing the crystalline semiconductor film by crystallization with laser irradiation, a continuous-wave laser beam (CW laser beam) or a pulsed wave laser beam (pulsed laser beam) can be used. As the laser beam that can be used here, a beam oscillated from one or more of gas lasers such as an Ar laser, a Kr laser, or an excimer laser; a laser using, as a medium, single crystalline YAG, $YVO_4$, forsterite ($Mg_2SiO_4$), $YAlO_3$, or $GdVO_4$, or polycrystalline (ceramic) YAG, $Y_2O_3$, $YVO_4$, $YAlO_3$, or $GdVO_4$ doped with one or more of Nd, Yb, Cr, Ti, Ho, Er, Tm, and Ta as a dopant; a glass laser; a ruby laser; an alexandrite laser; a Ti:sapphire laser; a copper vapor laser; and a gold vapor laser can be used. A crystal with a large grain size can be obtained by irradiation of a laser beam having a fundamental wave of such laser beams or one of second, third, and fourth harmonic of these fundamental waves. For instance, the second harmonic (532 nm) or the third harmonic (355 nm) of an Nd:$YVO_4$ laser (fundamental wave of 1,064 nm) can be used. This laser can be emitted with a CW or a pulsed wave. In a case of emitting the laser with a CW, the power density of approximately 0.01 to 100 $MW/cm^2$ (preferably, 0.1 to 10 $MW/cm^2$) is required. The scanning speed is set to be approximately 10 to 2,000 cm/sec for the irradiation.

It is to be noted that a laser using, as a medium, single crystalline YAG, $YVO_4$, forsterite ($Mg_2SiO_4$), $YAlO_3$, or $GdVO_4$, or polycrystalline (ceramic) YAG, $Y_2O_3$, $YVO_4$, $YAlO_3$, or $GdVO_4$ doped with one or more of Nd, Yb, Cr, Ti, Ho, Er, Tm, and Ta as a dopant; an Ar ion laser; or a Ti:sapphire laser can be continuously oscillated. Further, pulse oscillation thereof can be performed with a repetition rate of 10 MHz or more by carrying out Q switch operation or mode synchronization. When a laser beam is oscillated with a repetition rate of 10 MHz or more, a semiconductor film is irradiated with a next pulse while the semiconductor film is melted by the laser beam and solidified. Therefore, unlike in a case of using a pulsed laser with a low repetition rate, a solid-liquid interface can be continuously moved in the semiconductor film so that crystal grains, which continuously grow toward a scanning direction, can be obtained.

When ceramic (polycrystal) is used as a medium, the medium can be formed to have a free shape in a short time at low cost. When a single crystal is used, a columnar medium with several mm in diameter and several tens of mm in length is usually used. In the case of using the ceramic, a medium much larger can be formed.

Concentration of a dopant such as Nd or Yb in a medium, which directly contributes to a light emission, cannot be changed largely in both cases of the single crystal and the polycrystal; therefore, there is a limitation to some extent in improvement in output of a laser by increasing the concentration. However, in the case of the ceramic, the size of a medium can be significantly increased as compared with the single crystal; therefore, drastic improvement in output of a laser can be realized.

Further, in the case of the ceramic, a medium with a parallel hexahedron shape or a rectangular parallelepiped shape can be easily formed. In a case of using a medium having such a shape, when oscillated light is made to travel in a zigzag inside the medium, a long path of the oscillated light can be obtained. Therefore, amplitude is increased and a laser beam can be oscillated at high output. Furthermore, a cross-sectional shape of a laser beam, which is emitted from a medium having such a shape, is a quadrangular shape; therefore, as compared with a laser beam with a circular shape, the laser beam with the quadrangular shape in cross section has an advantage to be shaped into a linear beam. By shaping a laser beam emitted in the above described manner using an optical system, a linear beam with 1 mm or less in length of a minor axis and several mm to several m in length of a major axis can be easily obtained. In addition, when a medium is uniformly irradiated with excited light, a linear beam is emitted with uniform energy distribution in a long side direction.

By irradiating the semiconductor film with such a linear beam, an entire surface of the semiconductor film can be uniformly annealed. In a case where uniform annealing is required from one end to the other end of the linear beam, ingenuity such as arrangement of slits on both ends of the linear beam so as to shield an attenuated portion of energy from light is required.

When the semiconductor film is annealed using a linear beam with uniform intensity obtained in this manner and an electronic device is manufactured using the semiconductor film, characteristics of the electronic device are favorable and uniform.

Subsequently, if necessary, the semiconductor film is doped with the very small amount of impurity elements (boron or phosphorus) to control a threshold value of a TFT. Here, an ion doping method is used, in which excitation by plasma is conducted without conducting mass separation.

The island-like semiconductor film 3 is formed to have a thickness of 25 to 80 nm (preferably, 30 to 70 nm). Although there is no limitation on a material for the semiconductor film, the semiconductor film is preferably formed from silicon, a silicon-germanium (SiGe) alloy, or the like.

Then, a gate insulating film 4 is formed to cover the island-like semiconductor film 3. As the gate insulating film 4, a single layer structure or a stacked structure of a thermal oxidation film, a silicon oxide film, a silicon nitride film, a silicon oxynitride film, or the like can be used. A silicon oxide film is preferably used for the gate insulating film 4 to be in contact with the island-like semiconductor film 3. This is because a trap level in an interface between the gate insulating film 4 and the island-like semiconductor film is lowered when the gate insulating film 4 is formed of the silicon oxide film. Further, a silicon nitride film is preferably used for the gate insulating film to be in contact with a gate electrode when the gate electrode is formed from Mo. This is because a silicon nitride film does not oxidize Mo.

Here, as the gate insulating film 4, a silicon oxynitride film (composition ratio: Si=32%, O=59%, N=7%, and H=2%) having a thickness of 115 nm is formed by a plasma CVD method.

Next, a conductive layer is formed over the gate insulating film 4, and a shape of the conductive layer is processed using a mask formed by a photolithography method or the like to form a gate electrode 5. As a material for the gate electrode, Mo, Ti, W, Al, Nd, Cr, an alloy of these elements, or the like is used. Alternatively, the gate electrode 5 may be formed from these elements or formed by stacking an alloy of these elements. Here, the gate electrode is formed from Mo. Then, the island-like semiconductor film 3 is doped with an impurity element using the gate electrode 5 or a resist as a mask to form a channel formation region 8, and impurity regions 9 to be a source region and a drain region.

Then, a first interlayer insulating film 6 is formed using silicon nitride. Subsequently, an impurity element with which the island-like semiconductor film 3 is doped is activated and hydrogenated. It is to be noted that the first interlayer insulating film 6 may not be formed.

Next, a second interlayer insulating film 7 is formed using an inorganic material having a light-transmitting property (silicon oxide, silicon nitride, silicon oxynitride, or the like) or an organic compound material having a low dielectric constant (a photosensitive or nonphotosensitive organic resin material). Alternatively, the second interlayer insulating film may be formed using a material including siloxane. It is to be noted that siloxane is a material composed of a skeleton formed by the bond of silicon (Si) and oxygen (O), in which an organic group containing at least hydrogen (such as an alkyl group or an aromatic hydrocarbon) is included as a substituent. Alternatively, a fluoro group may be used as the substituent. Further alternatively, a fluoro group and an organic group containing at least hydrogen may be used as the substituent. The second interlayer insulating film 7 may have a stacked structure.

Next, a mask made of a resist is formed using a photomask. The first interlayer insulating film 6, the second interlayer insulating film 7, and the gate insulating film 4 are selectively etched using the mask to form a contact hole. Then, the mask made of a resist is removed.

A conductive film is formed over the second interlayer insulating film 7 by a sputtering method or a printing method. The conductive film may be a transparent conductive film or a film having a reflecting property. In a case of a transparent conductive film, for example, an indium tin oxide (ITO) film in which tin oxide is mixed in indium oxide, an indium tin silicon oxide (ITSO) film in which silicon oxide is mixed in indium tin oxide (ITO), an indium zinc oxide (IZO) film in which zinc oxide is mixed in indium oxide, a zinc oxide film, or a tin oxide film can be used. It is to be noted that IZO is a transparent conductive material formed by a sputtering method using a target in which 2 to 20 wt % of zinc oxide (ZnO) is mixed in ITO.

A transparent conductive film 10 is formed over the second interlayer insulating film 7, and subsequently, a metal film 11 is formed over the transparent conductive film 10. The transparent conductive film 10 and the metal film 11 can be successively formed by a sputtering method.

The metal film 11 is preferably formed from a material having resistance lower than that of the transparent conductive film because the transparent conductive film is formed from a material having high resistance in many cases. For example, Ti, Mo, Ta, Cr, W, Al, or the like can be used. In addition, a two-layer structure in which any of Ti, Mo, Ta, Cr, and W and Al are stacked, or a three-layer stacked structure in which Al is interposed between metal such as Ti, Mo, Ta, Cr, and W may be used. Then, after the entire surface of the metal film 11 is coated with a resist film, exposure is conducted using an exposure mask shown in FIG. 1A.

In a case of using an ITO film as the transparent conductive film, a step of crystallizing the ITO film by heat treatment is required. At the time, the metal film 11 may be formed after the ITO film is formed by a sputtering method and baked. In a case of using an ITSO film, the number of steps is decreased because a step of crystallization is not required.

In FIG. 1A, the exposure mask has light-shielding portions 12a and 12b by which exposure light is shielded and a semi light-transmitting portion 13 through which exposure light passes partially. The semi light-transmitting portion 13 is provided with a semi light-transmitting film 19 to reduce light intensity of exposure light. The light-shielding portions 12a and 12b are formed by stacking a metal film 20 over the semi light-transmitting film 19. A width of the light-shielding portion 12b is denoted by t1 and a width of the semi light-transmitting portion 13 is denoted by t2. Here, an example of using a semi light-transmitting film for the semi light-transmitting portion is shown; however, the present invention is not limited thereto, and the semi light-transmitting portion is acceptable as long as light intensity of exposure light is reduced. In addition, a diffraction grating pattern may be used for the semi light-transmitting portion.

The resist film is exposed using the exposure mask shown in FIG. 1A, thereby forming a non-exposure region 14a and an exposure region 14b in the resist film. In exposing the resist film, light is reflected by the light-shielding portions 12a and 12b or passes through the semi light-transmitting portion 13, and accordingly, the exposure region 14b shown in FIG. 1A is formed.

Figure 1B:
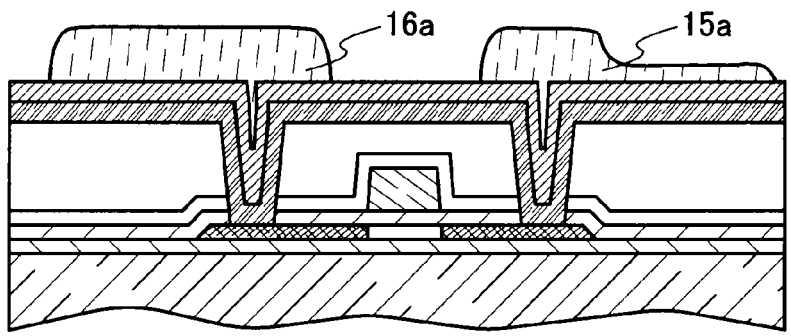

When developing is conducted, the exposure region 14b is removed, and accordingly, a resist pattern 15a having two thicknesses, which are roughly divided, and a resist pattern 16a having an almost uniform thickness are obtained over the metal film 11 as shown in FIG. 1B. The resist pattern 15a has a region having a thick thickness and a region having a thickness thinner than the region. A thickness of the region having a thin thickness can be adjusted by adjusting exposure energy or transmittance of the semi light-transmitting film 19. The resist pattern 15a is left-right asymmetric and the resist pattern 16a is left-right symmetric.

Next, the metal film 11 and the transparent conductive film 10 are etched by dry etching. The dry etching is conducted with a dry etching apparatus using a high density plasma source such as ECR (Electron Cycrotron Resonance) and ICP (Inductive Coupled Plazma).

Here, an example of using an ICP etching apparatus is shown; however, the present invention is not limited thereto, and for example, a parallel-plate etching apparatus, a magnetron etching apparatus, an ECR etching apparatus, or a helicon-type etching apparatus may also be employed.

Alternatively, the metal film 11 and the transparent conductive film 10 may be etched by wet etching. However, dry etching is suitable for microfabrication; therefore, dry etching is preferable. The material for the metal film 11 and the transparent conductive film 10 is different from the material for the second interlayer insulating film 7; therefore, high etching selectivity of the second interlayer insulating film 7 with respect to the metal film 11 and the transparent conductive film 10 can be obtained even if dry etching is conducted. In order to make etching selectivity further high, at least a top layer of the second interlayer insulating film 7 may be formed of a silicon nitride film.

Figure 1C:
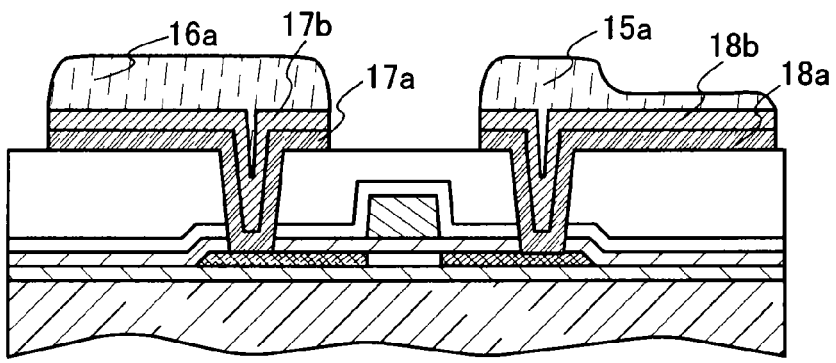

In this manner, as shown in FIG. 1C, a pattern formed by stacking a transparent conductive film 17a and a metal film 17b, and a pattern formed by stacking a transparent conductive film 18a and a metal film 18b are formed over the second interlayer insulating film 7.

Figure 2A:
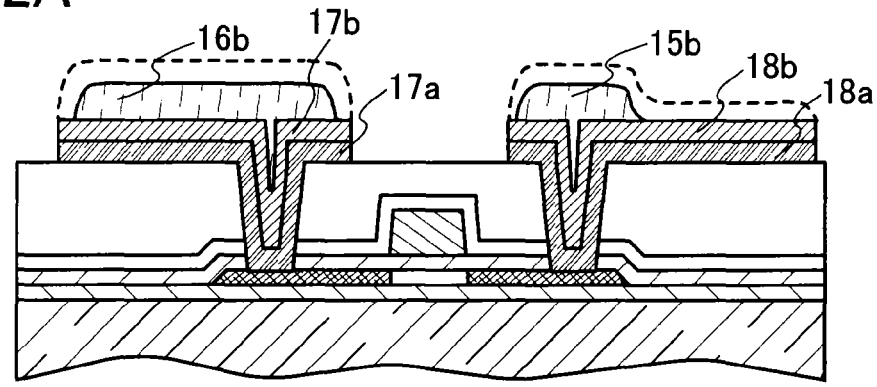
FIGS. 2A to 2C are cross-sectional views each showing a manufacturing process of a semiconductor device (Embodiment Mode 1)

Next, ashing or etching is conducted to the resist patterns 15a and 16a (FIG. 2A). In accordance with this step, a region having a thin thickness in the resist pattern 15a is etched and a total thickness of the resist patterns 15a and 16a is decreased by a thickness of the region having a thin thickness. Thus, resist patterns 15a and 16b are formed. The resist patterns 15a and 16a are etched not only in a thickness direction but also a width direction; therefore, widths of the resist patterns 15b and 16b are decreased more than widths of the metal films 17b and 18b, and the transparent conductive films 17a and 18a.

Figure 2B:
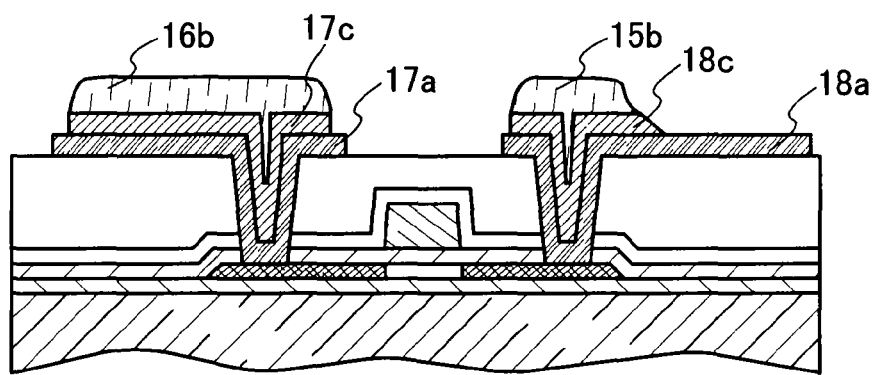

Thus, sides of the resist patterns 15b and 16b and sides of the metal film and the transparent conductive film in the lower layer do not coincide, and the sides of the resist patterns 15b and 16b recede. In FIG. 2B, the resist pattern 15b is left-right asymmetric and the resist pattern 16b is left-right symmetric.

Then, the metal film 18b is etched using the resist pattern 15b to form a metal film 18c (FIG. 2B). The metal film 18b is preferably formed from a material capable of obtaining high etching selectivity with respect to the transparent conductive film 18a so that the transparent conductive film 18a is not etched unnecessarily at this time. For example, Ti, Mo, Cr, Al, or the like is preferable as a material for the metal film 18b if a material for the transparent conductive film 18a is ITSO, and the metal film 18b may have a stacked structure formed from these materials. Then, the metal film 18c with a smaller pattern, namely a smaller plane-surface area, than the transparent conductive film 18a is formed. On the other hand, the metal film 17b is also etched using the resist pattern 16b to form a metal film 17c with a smaller plane-surface area than the transparent conductive film 17a.

Although etching of the metal films 17b and 18b through FIGS. 2A to 2B may be conducted by dry etching or wet etching, FIG. 2B shows a case where the metal films 17c and 18c are formed by dry etching. In a case of conducting dry etching, sides of the metal film 18c in cross section are asymmetric. This is because the metal film 18c reflecting an asymmetric shape of the resist pattern 15b is formed. The metal film 18c has a cross-sectional shape in which one side is more inclined than the other side. Sides of the metal film 17c are formed so that the sides of the metal film 17c and sides of the resist pattern 16b coincide. One side of the metal film 18c is on an extended line of one side of the resist pattern 15b, and the other side thereof and the other side of the resist pattern 15b coincide.

Figure 4A:
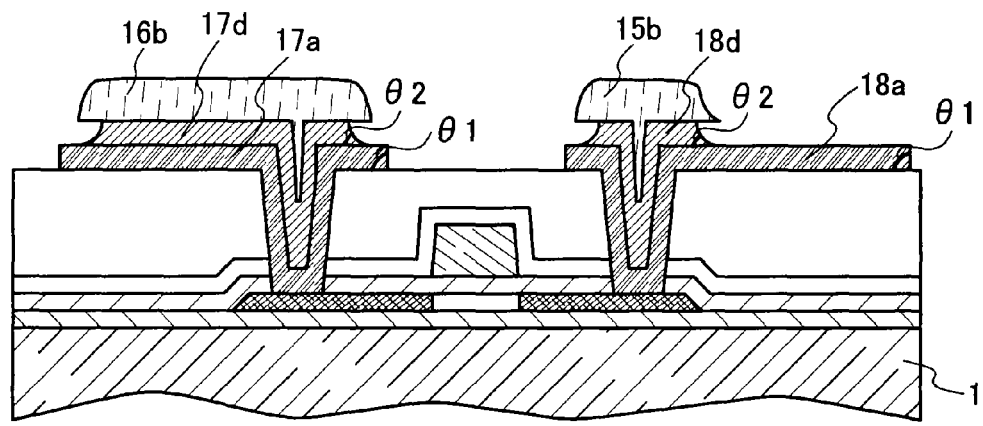
FIGS. 4A and 4B are cross-sectional views each showing a manufacturing process of a semiconductor device (Embodiment Mode 1)
Figure 4B:
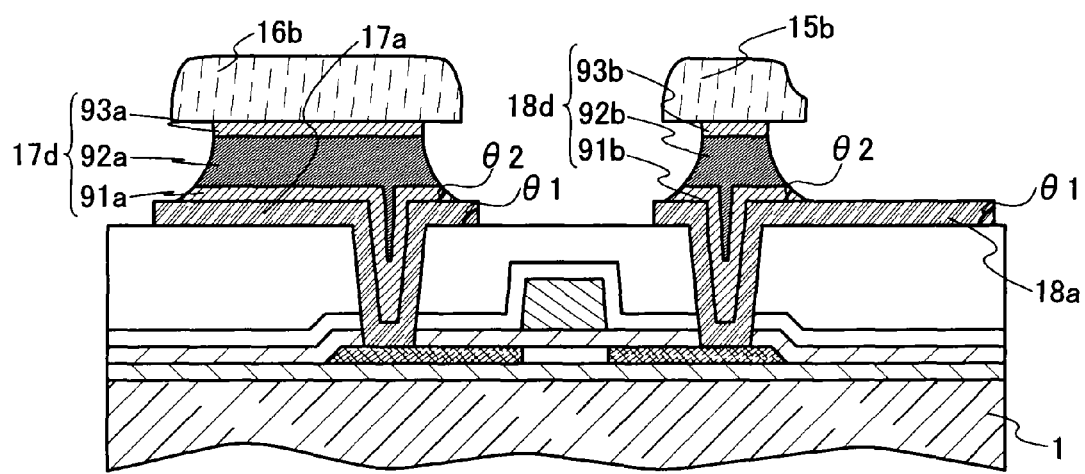

If the metal films 17b and 18b are etched by wet etching, etching is conducted isotropically. Accordingly, metal films smaller than the resist patterns 15b and 16b are formed. FIGS. 4A and 4B show views in a case of conducting wet etching. In FIG. 4A, metal films 17b and 18b are etched by wet etching to form metal films 17d and 18d, respectively. Portions other than these in FIG. 4A are the same as in FIG. 2B.

Sides of the resist patterns 15b and 16b and sides of the metal films 17d and 18d do not coincide. Therefore, the metal films 17d and 18d, which are further smaller, are formed by wet etching than dry etching even if the same resist patterns 15b and 16b are used as masks.

FIG. 4B is a view in a case where a metal film 17d is formed by stacking three layers. For example, the metal film 17d has a stacked structure in which an aluminum film 92a is interposed between Ti films 91a and 93a, and sides of the metal film 17d and a resist pattern 16b do not coincide. In addition, a metal film 18d also has a stacked structure in which an aluminum film 92a is interposed between Ti films 91b and 93b, and sides of the metal film 18d and a resist pattern 15b do not coincide.

In FIGS. 4A and 4B, transparent conductive films 17a and 18a are formed by dry etching. Therefore, each side thereof has an angle $\theta_1$, which is almost perpendicular or close to 90° with respect to a substrate surface. On the other hand, if the metal films 17d and 18d are formed by wet etching, each side thereof has an acute angle $\theta_2$ with respect to the substrate surface by isotropic etching. Therefore, $\theta_1 > \theta_2$ is satisfied when the angle $\theta_1$ of the side of the transparent conductive film and the angle $\theta_2$ of the side of the metal film are compared with each other. It is to be noted that the angle $\theta_1$ refers to an inclined angle of the side of the transparent conductive film with respect to the surface of the substrate 1, and the angle $\theta_2$ refers to an inclined angle of the side of the metal film with respect to the surface of the substrate 1. Each of the angles $\theta_1$ and $\theta_2$ is within the range of 0 to 90°.

In a case where the metal film has a stacked structure as shown in FIG. 4B, etching rate is different in each layer in some cases. In accordance with this, the angles formed by the side of each layer with respect to the substrate surface are different from each other in some cases. Therefore, in a case where the metal film is a stack, an angle formed by the side of the film in the lowest layer with respect to the substrate surface is denoted by $\theta_2$.

It is to be noted that the sides of the metal films 17d and 18d, and sides of the transparent conductive films 17a and 18a are not smooth but uneven in some cases. In this case, the angles $\theta_1$ and $\theta_2$ may be appropriately determined. For example, the angles $\theta_1$ and $\theta_2$ can be determined using a rough straight line or curved line drawn with respect to an uneven side. Alternatively, a number of angles $\theta_1$ and $\theta_2$ can be taken based on an uneven side, and average values thereof can be angles $\theta_1$ and $\theta_2$. The most rational method may be employed.

As described above, the metal films 17c and 18c or the metal films 17d and 18d are formed by any of dry etching and wet etching. Even if the metal films are formed by either dry etching or wet etching, the metal films 17c and 18c or the metal films 17d and 18d having sides receded from the sides of the transparent conductive films 17a and 18a, respectively, are formed. In other words, the metal film 17c or 17d having a smaller plane-surface area than the transparent conductive film 17a and the metal film 18c or 18d having a smaller plane-surface area than the transparent conductive film 18a are formed. One of the reasons is that the sizes of the resist patterns 15a and 16a, which are masks for forming the transparent conductive films 17a and 18a, and the sizes of the resist patterns 15b and 16b, which are masks for forming the metal films, are different from each other, and the sizes of the resist patterns 15b and 16b are smaller than that of the resist patterns 15a and 16a.

Figure 2C:
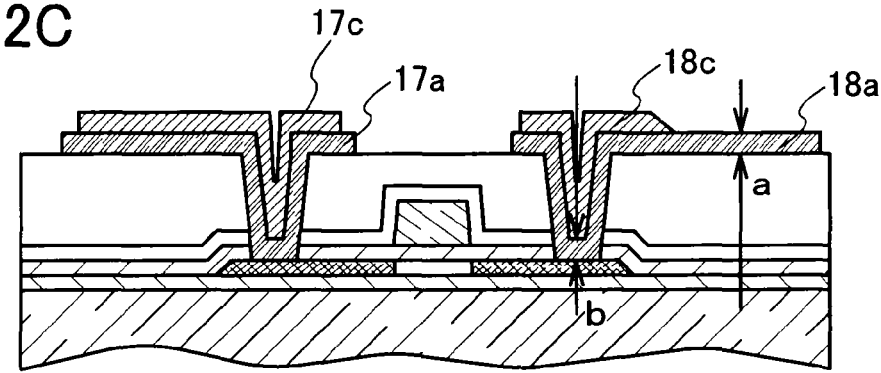

Thereafter, the resist patterns 15b and 16b are removed (FIG. 2C). Accordingly, a wiring or an electrode formed of the transparent conductive film 17a and the metal film 17c, and a wiring or an electrode formed of the transparent conductive film 18a and the metal film 18c are formed. The transparent conductive film 18a serves as a pixel electrode. If the resist patterns 15b and 16b are removed from FIGS. 4A and 4B, the wiring or the electrode formed of the transparent conductive film 17a and the metal film 17d, and the wiring or the electrode formed of the transparent conductive film 18a and the metal film 18d are formed.

When the metal film 18b is etched using the resist pattern 15b as a mask, part of the surface of the transparent conductive film 18a is etched in some degree. In particular, when the metal film 18c is formed by dry etching, selectivity between the transparent conductive film in the lower layer and the metal film 18b is difficult to obtain; therefore, part of the surface of the transparent conductive film 18a is etched more easily. Thus, thickness a<thickness b is satisfied when the thicknesses a and b of the transparent conductive film 18a in FIG. 2C are compared with each other. It is to be noted that the thickness a refers to an average thickness of the transparent conductive film 18a in a portion where the transparent conductive film 18a does not overlap with the metal film 18c or the metal film 18d, and the thickness b refers to a thickness of the transparent conductive film 18a in a bottom portion of the contact hole reaching the impurity region 9.

In a case where a light emitting element is stacked over the TFT shown in FIG. 2C to form a light emitting device which emits light in a direction of the substrate 1, a thin thickness of the transparent conductive film 18a makes transmittance high, and accordingly, bright display can be provided. Thus, the thickness a is preferably thin. In addition, the surface of the transparent conductive film 18a can be etched in etching the metal film 18b using the resist pattern 15b as a mask. Therefore, dust over the surface can be removed, and accordingly, short-circuit of the light emitting element due to dust can be prevented.

One side of the metal film 18c formed in this embodiment mode is inclined. Accordingly, in a case where the metal film 18c is utilized for a liquid crystal display device, rubbing can be conducted smoothly on the side of the metal film 18c when rubbing is conducted from the inclined side of the metal film 18c. When rubbing is conducted from a direction in which the side of the metal film 18c is perpendicular, there is a case where rubbing is conducted imperfectly for a reason such as stress on a rubbing cloth in a portion of a perpendicular side, thereby obtaining imperfect alignment. Therefore, rubbing is preferably conducted from the inclined side of the metal film 18c.

As shown in FIGS. 4A and 4B, in a case where the metal films 17d and 18d each having inclined sides are formed, rubbing can be conducted smoothly from either direction and becomes further effective.

Figure 3:
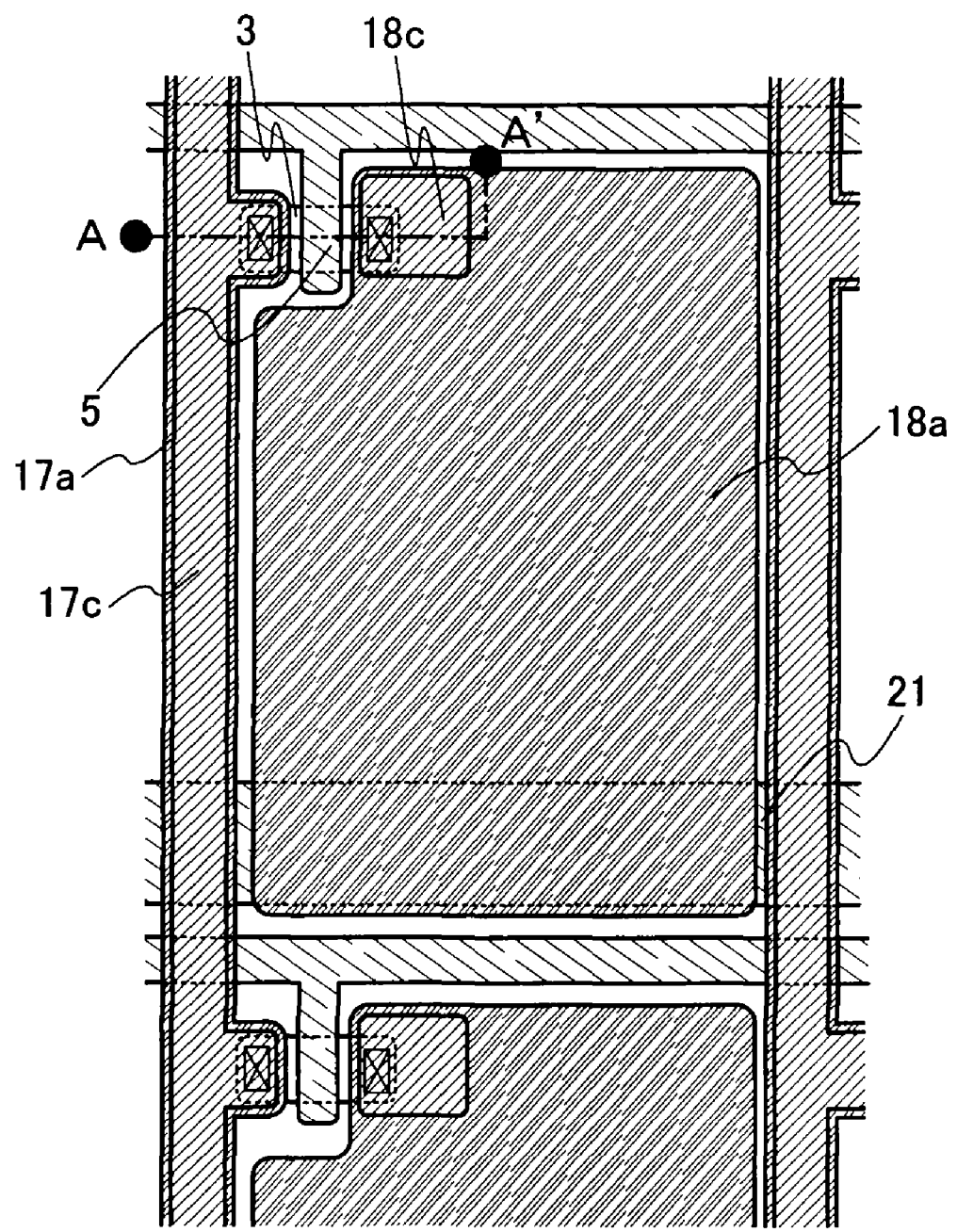
FIG. 3 is a top view of a semiconductor device (Embodiment Mode 1)

FIG. 3 shows a top view of FIG. 2C. FIG. 2C is a cross-sectional view taken along a line A-A' in FIG. 3. As apparent from FIG. 3, the wiring or the electrode formed by stacking the transparent conductive film 17a and the metal film 17c serves as a source electrode or a drain electrode of a TFT and also serves as a source wiring. In addition, the wiring or the electrode formed of the transparent conductive film 18a and the metal film 18c serves as a source electrode or a drain electrode of the TFT and also serves as a pixel electrode. Strictly, a portion of the transparent conductive film 18a which does not overlap with the metal film 18c serves as a pixel electrode and transmits light. A capacitor wiring 21 is formed of the same layer as the gate electrode 5, and the capacitor wiring 21 forms a capacitor by overlapping with the transparent conductive film 18a. It is to be noted that the capacitor wiring 21 may be formed of the different layer from the gate electrode 5. The side of the metal film 17c and the side of the transparent conductive film 17a do not coincide, and is located inside the side of the transparent conductive film 17a. The side of the metal film 18c and the side of the transparent conductive film 18a do not coincide, and the side of the metal film 18c is located inside the side of the transparent conductive film 18a. The relation between the metal film 17d and the transparent conductive film 17a and the relation between the metal film 18d and the transparent conductive film 18a, which are explained in FIGS. 4A and 4B, are the same as described above.

In this embodiment mode, it is extremely effective to form a transparent conductive film serving as a pixel electrode over a plane surface in terms of preventing disconnection of the transparent conductive film. When the metal film 18c is formed by etching, the surface of the transparent conductive film 18a in the lower layer, which is exposed from the metal film 18c, is also etched in some degree. Therefore, if a thickness of the transparent conductive film is nonuniform owing to the formation of the transparent conductive film 18a over a surface having level difference, a portion of the transparent conductive film having a thin thickness is etched by etching for forming the metal film 18c. In accordance with this, disconnection of the transparent conductive film may occur. When disconnection occurs, light leakage is generated in the disconnected portion, or an area of the pixel electrode becomes small and aperture ratio is lowered. Therefore, the portion of the transparent conductive film 18a exposed from the metal film 18c is preferably formed over the plane surface. Thus, it is preferable that the second interlayer insulating film 7 be formed from an organic material to form the second interlayer insulating film having a plane surface.

When a stack of the metal film and the conductive film is formed in accordance with the present invention, a structure is obtained, in which the conductive film is located to be in contact with the lower portion of the metal film. However, in a portion having large level difference, the conductive film is not necessarily located to be in contact with the lower portion of the metal film. This is because there is a possibility that the conductive film is disconnected owing to the level difference. Therefore, favorably, the metal film is arranged over the conductive film in a contact hole portion reaching the impurity region 9 in FIGS. 1A to 1C.

Figure 19:
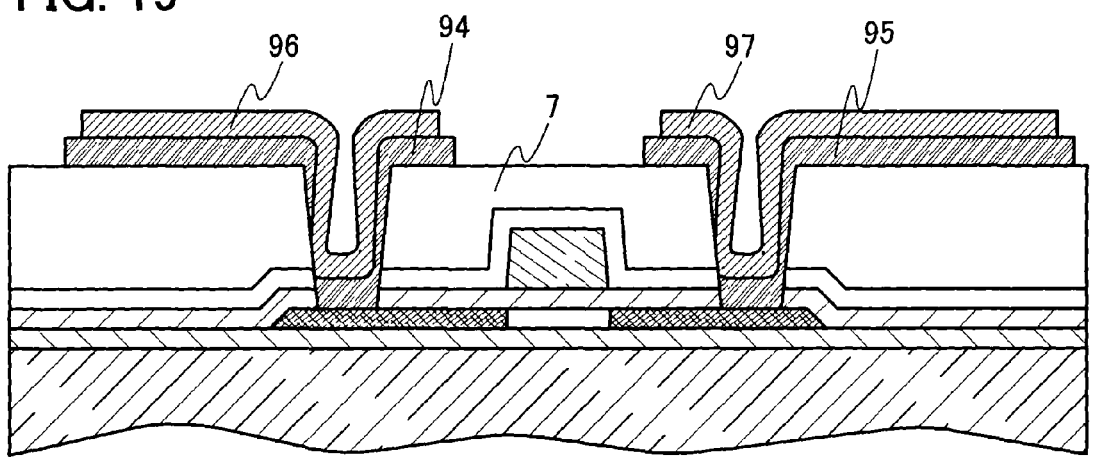
FIG. 19 is a cross-sectional view of a semiconductor device (Embodiment Mode 1)

FIG. 19 shows a state where a conductive film is disconnected in a contact hole. Conductive films 94 and 95 are partially disconnected owing to an inclined side of the contact hole. However, if the metal films 96 an 97 are formed over the conductive films 94 and 95 in the contact hole portion, disconnected conductive films can be electrically connected to each other through the metal film even if the transparent conductive film is disconnected. In this case, there is a portion where the metal films 96 and 97 are in contact with the second interlayer insulating film 7 over the side of the contact hole. The conductive film in the contact hole portion does not serve as a pixel electrode; therefore, there is no problem remaining the metal film above. Accordingly, in the structure in this embodiment mode, electrical connection of the transparent conductive film can be compensated by the metal film formed above even if the transparent conductive film is disconnected in the contact hole, and accordingly, a display defect can be prevented.

The metal film is preferably made to remain over the conductive film also in a portion having level difference in the conductive film due to the capacitor wiring 21 in FIG. 3. Even if the conductive film is disconnected due to level difference, the conductive films can be electrically connected to each other through the metal film. Therefore, a capacitor can be certainly formed.

It is to be noted that a shape of the transparent conductive film 18a in FIG. 3 is one example, and another shape may be used. For example, if the transparent conductive film 18a has an edge with a comb shape, the transparent conductive film 18a can serve as a pixel electrode to be used for an IPS (In-Plane-Switching) method or an FFS (Fringe Field Switching) method, or a pixel electrode to be used for a MVA (Multi-domain Vertical Alignment) method or a PVA (Patterned Vertical Alignment) method by putting a slit therein.

In accordance with the above, the number of manufacturing steps can be reduced because the transparent conductive film and the metal film can be formed using one resist pattern. In addition, by stacking the metal film, resistance can be lowered and conductivity can be enhanced while the transparent conductive film is utilized as the wiring or the electrode.

In a case where the resist patterns 15a and 16a are naturally etched to be the resist patterns 15b and 16b during etching of the transparent conductive film 10 and the metal film 11 from a state shown in FIG. 1B, a step of forming the resist patterns 15b and 16b by ashing or etching the resist pattern may not be provided.

This embodiment mode is explained using a top-gate TFT having an island-like semiconductor film formed of a crystalline semiconductor film. However, this embodiment mode can also be applied to a bottom-gate TFT formed of a crystalline semiconductor film. In addition, in this embodiment mode, the island-like semiconductor film has the impurity regions 9 to be a source region and a drain region and the channel formation region 8; however, a low concentration impurity region, an offset region, and the like can be provided in addition to these.

Embodiment Mode 2

This embodiment mode will be explained with reference to FIGS. 5A to 5C. As for a forming method, a material, and the like of a type of a substrate and each layer which form a TFT to be explained in this embodiment mode, see Embodiment Mode 1.

An insulating film 402 is formed as a base film over a substrate 401. It is to be noted that a base film may not be provided. Then, a conductive layer is formed over the insulating film 402, and a shape of the conductive layer is processed using a mask formed by a photolithography method or the like to form a gate electrode 403.

A gate insulating film 404 is formed to cover the gate electrode 403. An amorphous semiconductor film is formed over the gate insulating film 404. Although there is no limitation on a material for the amorphous semiconductor film, the amorphous semiconductor film is favorably formed from silicon, a silicon-germanium (SiGe) alloy, or the like. Subsequently, a conductive layer is formed over the amorphous semiconductor film. The conductive layer can be formed of, for example, an amorphous silicon film including phosphorus. Then, shapes of the amorphous semiconductor film and the conductive layer are processed using a mask formed by a photolithography method or the like to form an island-like semiconductor film 405 and a conductive layer 406.

A transparent conductive film 407 and a metal film 408 are stacked over the conductive layer 406. It is to be noted that a conductive layer having a reflecting property may be used instead of the transparent conductive film. As the transparent conductive film, the material for the transparent conductive film shown in Embodiment Mode 1 can be used. Then, after the entire surface of the metal film 408 is coated with a resist film, exposure is conducted using an exposure mask shown in FIG. 5A.

Figure 5A:
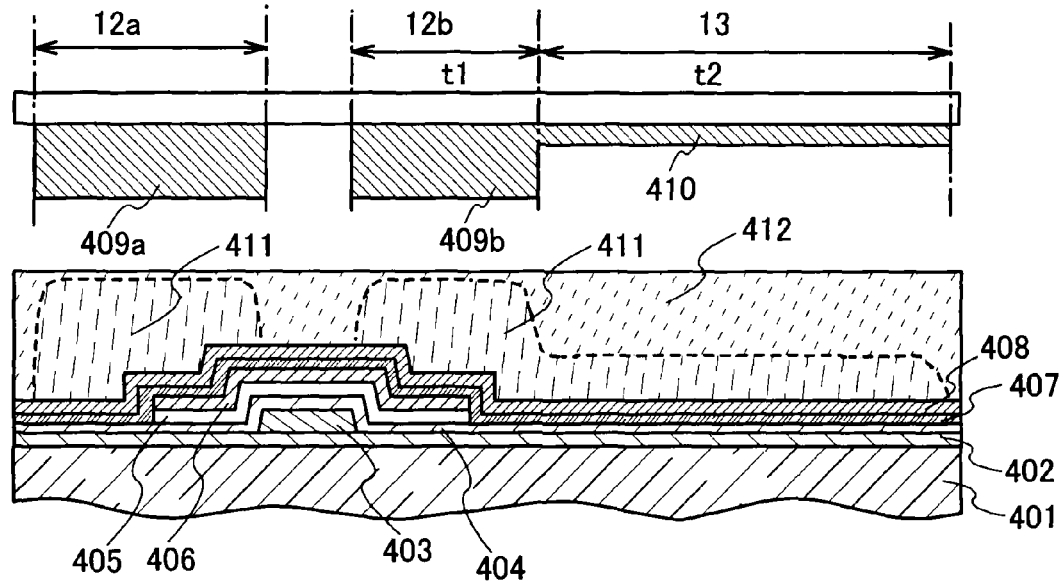
FIGS. 5A to 5C are cross-sectional views each showing a manufacturing process of a semiconductor device (Embodiment Mode 2)

In FIG. 5A, the exposure mask has light-shielding portions 409a and 409b and a semi light-transmitting portion 410. A diffraction pattern or a semi light-transmitting film can be used for the semi light-transmitting portion 410. When the resist film is exposed using the exposure mask shown in FIG. 5A, a non-exposure region 411 and an exposure region 412 are formed in the resist film. Then, developing is conducted to form resist patterns 413a and 414a as shown in FIG. 5B. The resist pattern 414a includes a developed region 422 (a portion of the resist pattern 414a on the left side of a dashed line), which corresponds to the light-shielding portion 409b during the exposure, and a developed region 423 (a portion of the resist pattern 414a on the right side of the dashed line), which corresponds to the semi light-transmitting portion 410 during the exposure.

Next, the metal film 408 and the transparent conductive film 407 are etched by dry etching. Accordingly, as shown in FIG. 5C, a pattern formed by stacking a transparent conductive film 415 and a metal film 416 and a pattern formed by stacking a transparent conductive film 419 and a metal film 420 are formed. The etching may be conducted by wet etching. However, dry etching is suitable for microfabrication; therefore, dry etching is preferable. The materials for the metal film 408 and the transparent conductive film 407 are different from the material for the gate insulating film 404; therefore, high etching selectivity can be obtained even if dry etching is conducted. Further, in order to make the etching selectivity high, at least a top layer of the gate insulating film 404 may be formed of a silicon nitride film.

Figure 6A:
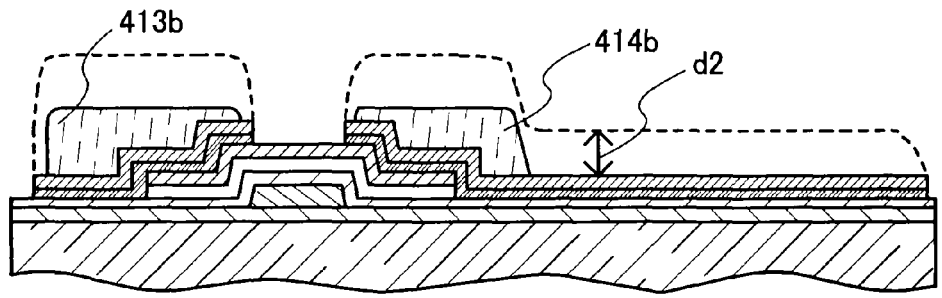
FIGS. 6A to 6C are cross-sectional views each showing a manufacturing process of a semiconductor device (Embodiment Mode 2)

Next, as shown in FIG. 6A, ashing or etching is conducted to the resist patterns 413a and 414a. In accordance with this step, the region 423 of the resist pattern 414a is removed, and a thickness of the region 422 of the resist pattern 414a becomes thinner by a thickness d2 of this region 423 to form a resist pattern 414b. Ashing of the resist pattern 413a is also conducted by the thickness d2 to form a resist pattern 413b. Further, etching is conducted also in a width direction; therefore, widths of the resist patterns 413b and 414b become smaller than widths of a metal film 416, the metal film 420, and the transparent conductive films 415 and 419. Therefore, sides of the resist patterns 413b and 414b and sides of the metal films and the transparent conductive films in the lower layer do not coincide, and the sides of the resist patterns 413b and 414b recede. Further, angles of the sides of the resist pattern 414b with respect to a substrate surface are different from each other. On the other hand, angles of the sides of the resist pattern 413b with respect to the substrate surface are almost the same.

Figure 6B:
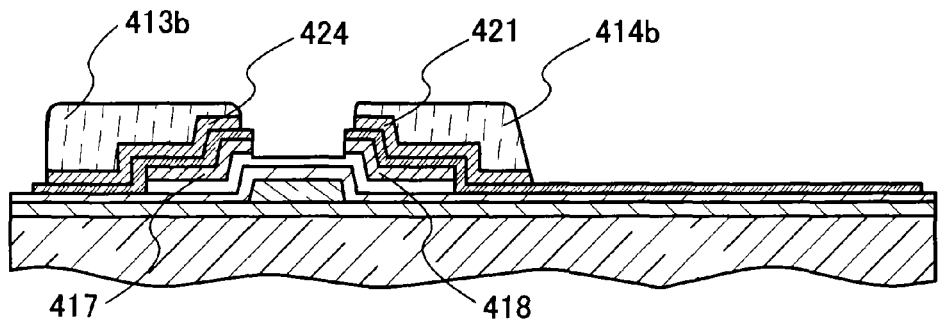

Then, the metal film 416 is etched using the resist pattern 414b to form a metal film 421. Further, the metal film 420 is etched using the resist pattern 413b to form a metal film 424 (FIG. 6B). At this time, the transparent conductive film 415 is not etched unnecessarily. The metal films 424 and 421 are formed to have patterns smaller than the transparent conductive films 419 and 415. The conductive layer 406 is etched using the transparent conductive films 419 and 415 as masks to form conductive layers 417 and 418. Part of the island-like semiconductor film 405 is etched somewhat. One edge portion of the transparent conductive film 419 and one edge portion of the conductive layer 417 coincide, and one edge portion of the transparent conductive film 415 and one edge portion of the conductive layer 418 coincide. The metal films 421 and 424 are formed in the same step.

In addition, the conductive layer 406 may be etched at the same time as etching for forming the metal films 421 and 424.

Then, the resist patterns 413b and 414b are removed to form a wiring or an electrode formed of the transparent conductive film 419 and the metal film 424, and a wiring or an electrode formed of the metal film 421 and the transparent conductive film 415. The transparent conductive film 415 serves as a pixel electrode (FIG. 6C).

Figure 5B:
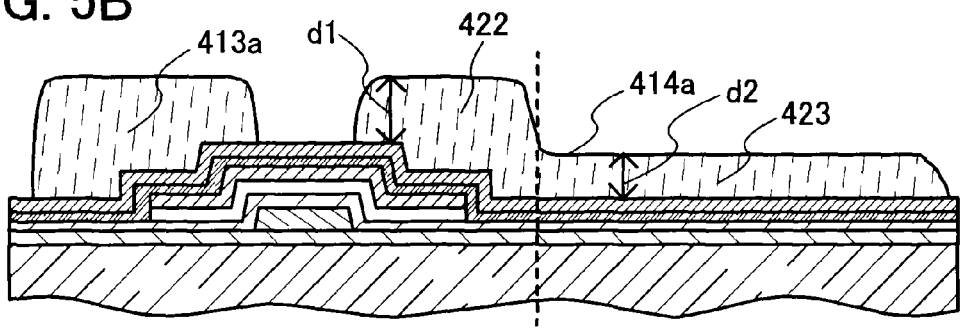
Figure 5C:
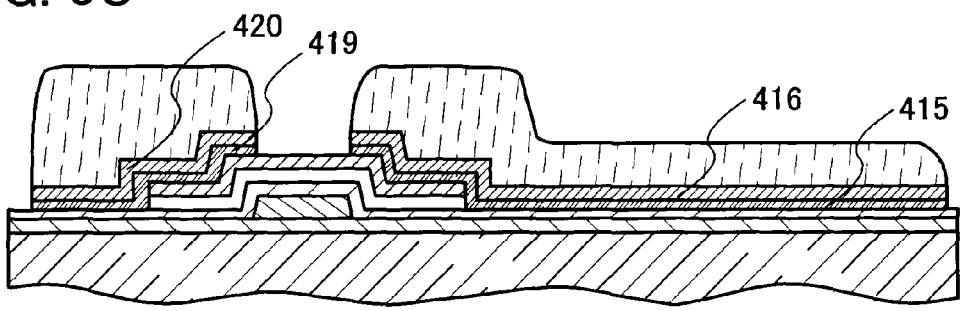
Figure 6C:
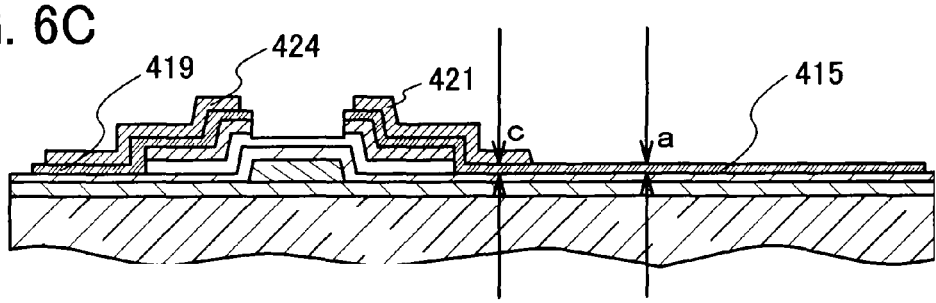

Although the conductive layers 417 and 418 can be formed at the same time as etching of FIG. 5C, it is preferable to etch the conductive layers 417 and 418 in forming or after forming the metal films 424 and 421 as shown in FIGS. 6A to 6C. This is because there is a possibility that the island-like semiconductor film is further etched in forming the metal films 424 and 421 if the island-like semiconductor film is exposed in a stage of FIG. 5C.

Etching of FIG. 6B may be conducted by dry etching or wet etching. In a case of conducting dry etching, a cross-sectional shape of the metal film 421 reflects a shape of the resist pattern 414b to be left-right asymmetric as shown in FIGS. 6B and 6C. In other words, the metal film 421 has a cross-sectional shape in which one side is more inclined than the other side. One side of the metal film 421 and one side of the resist pattern 414b coincide, and the other side of the metal film 421 is on an extended line of the other side of resist pattern 414b. The metal film 424 is formed so that a side thereof and a side of the resist pattern 413b coincide.

A case of forming the metal films 421 and 424 by wet etching will be explained with reference to FIG. 8. The metal films 421 and 424 formed by dry etching are substituted by metal films 425 and 426 in a case of being formed by wet etching.

Figure 8:
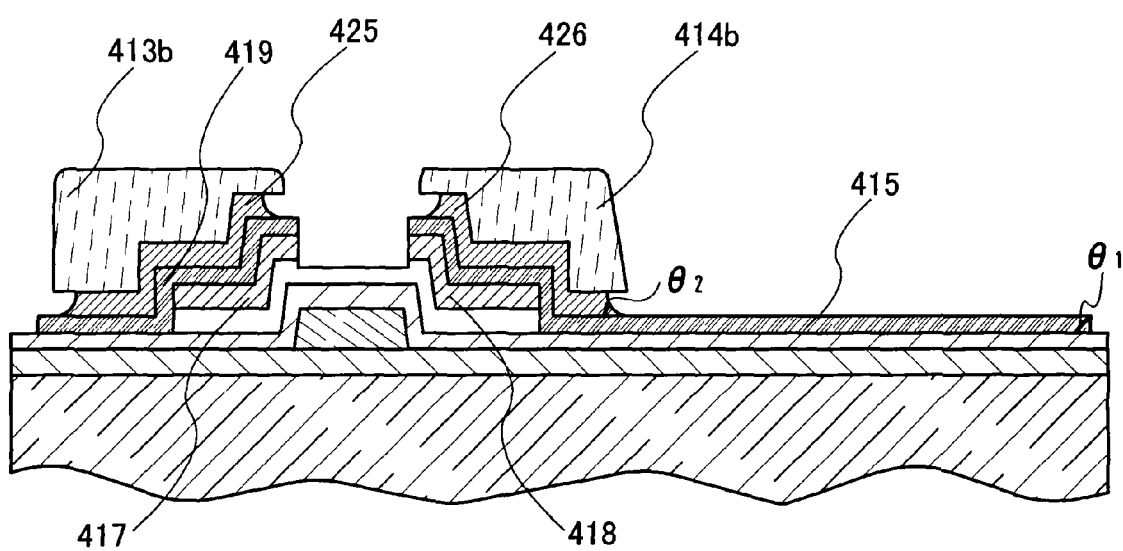
FIG. 8 is a cross-sectional view showing a manufacturing process of a semiconductor device (Embodiment Mode 2)

In a case of wet etching, as shown in FIG. 8, the metal films 425 and 426 smaller than resist patterns 413b and 414b are formed, and sides of the resist patterns 413b and 414b and sides of the metal films 425 and 426 do not coincide. Therefore, the metal film having a further smaller plane-surface area is formed by wet etching than dry etching even if the same resist patterns 413b and 414b are used as masks. In the same manner as FIGS. 4A and 4B, in a case where the metal film is formed by wet etching, $\theta_1 > \theta_2$ is satisfied when an angle $\theta_1$ of a side of transparent conductive films 415 and 419 and an angle $\theta_2$ of the side of the metal films 425 and 426 are compared with each other. It is to be noted that the angle $\theta_1$ refers to an inclined angle of the side of the transparent conductive film with respect to the surface of the substrate 401, and the angle $\theta_2$ refers to an inclined angle of the side of the metal film with respect to the surface of the substrate 401. Each of the angles $\theta_1$ and $\theta_2$ is within the range of 0 to 90°. Alternatively, when the metal films 425 and 426 each have a stacked structure as shown in FIG. 4B, an angle of a side of a film in the lowest layer with respect to the substrate surface is denoted by $\theta_2$.

It is to be noted that, in a case of wet etching, the conductive layer 406 may be etched at the same time as etching in FIG. 5C or may be etched after forming the metal films 425 and 426 in FIG. 6B.

Even if the metal films are formed by either dry etching or wet etching, the metal film 425 or 424 having sides receding from the sides of the transparent conductive film 419, and the metal film 421 or 426 having sides receding from the sides of the transparent conductive film 415 are formed. In other words, the metal film 424 or 425 having a smaller plane-surface area than the transparent conductive film 419 and the metal film 421 or 426 having a smaller plane-surface area than the transparent conductive film 415 are formed.

Then, the resist patterns 413b and 414b are removed, and a wiring or an electrode formed of the transparent conductive film 419 and the metal film 424, and a wiring or an electrode formed of the metal film 421 and the transparent conductive film 415 are formed (FIG. 6C). If the resist patterns 413b and 414b are removed from FIG. 8, the wiring or the electrode formed of the transparent conductive film 419 and the metal film 425, and the wiring or the electrode formed of the transparent conductive film 415 and the metal film 426 are formed.

If a stack of the metal film 421 and the transparent conductive film 415 is formed using the resist pattern 414a having regions different in thickness of the present invention, part of the surface of the transparent conductive film 415 is etched in some degree in forming the metal film 421. In particular, when the metal film 421 is formed by dry etching, selectivity between the transparent conductive film 415 in the lower layer and the metal film 421 is difficult to obtain; therefore, part of the surface of the transparent conductive film 415 is etched more easily. Thus, thickness a<thickness c is satisfied when the thickness a (a thickness of the transparent conductive film 415 exposed from the metal film 421) and the thickness c (a thickness of the transparent conductive film to be in contact with the gate insulating film 404 and the metal film 421) of the transparent conductive film 415 in FIG. 6C are compared with each other. It is to be noted that each of the thicknesses a and c is an average thickness.

In a case where a light emitting element is stacked over the TFT shown in FIG. 6C to form a light emitting device, the following effect can be obtained by thickness a<thickness c. If a light emitting device which emits light in a direction of the substrate 401 is used, a thin thickness a can provide bright display. In addition, the surface of the transparent conductive film 415 can be etched; therefore, dust over the surface can be removed, and accordingly, short-circuit of the light emitting element can be prevented.

One side of the metal film 421 formed in this embodiment mode is inclined. Accordingly, in a case where the metal film 421 is utilized for a liquid crystal display device, rubbing can be conducted smoothly on the side of the metal film 421 when rubbing is conducted from the inclined side of the metal film 421. When rubbing is conducted from a direction in which the side of the metal film 421 is perpendicular, there is a case where rubbing is conducted imperfectly for a reason such as stress on a rubbing cloth in a portion of a perpendicular side, thereby obtaining imperfect alignment. Therefore, rubbing is preferably conducted from the inclined side of the metal film 421.

As shown in FIG. 8, in a case where the metal films 425 and 426 each having inclined sides are formed by wet etching, rubbing can be conducted smoothly from either direction and becomes further effective.

FIG. 7 is a top view of FIG. 6C. FIG. 6C is a cross-sectional view taken along a line A-A' in FIG. 7. As shown in FIG. 7, the wiring or the electrode formed by stacking the transparent conductive film 419 and the metal film 424 serves as a source electrode or a drain electrode of a TFT and also serves as a source wiring. In addition, the wiring or the electrode formed of the transparent conductive film 415 and the metal film 421 serves as a source electrode or a drain electrode of the TFT and also serves as a pixel electrode. Strictly, a portion of the transparent conductive film 415 which does not overlap with the metal film 421 serves as a pixel electrode. A capacitor wiring 430 is formed of the same layer as the gate electrode 403, and the capacitor wiring 430 forms a capacitor by overlapping with the transparent conductive film 415. It is to be noted that the capacitor wiring 430 may be formed of the different layer from the gate electrode. The side of the metal film 424 and the side of the transparent conductive film 419 do not coincide, and the side of the metal film 424 is located inside the side of the transparent conductive film 419. The side of the metal film 421 and the side of the transparent conductive film 415 do not coincide, and the side of the metal film 421 is located inside the side of the transparent conductive film 415. The relation between the metal film 425 and the transparent conductive film 419 and the relation between the metal film 426 and the transparent conductive film 415, which are explained in FIG. 8, are the same as described above.

In addition, it is effective to cover the transparent conductive film 415, which is formed over level difference due to the capacitor wiring 430, the gate electrode 403, or the island-like semiconductor film 405, with the metal film 421 in terms of preventing disconnection of the transparent conductive film serving as a pixel electrode. When the metal film 421 is formed by etching, the transparent conductive film 415 is also etched in some degree. Therefore, if a thickness of the transparent conductive film is nonuniform, disconnection of the transparent conductive film occurs in this etching. Therefore, it is preferable to utilize a portion of the transparent conductive film over a plane surface over which a uniform thickness is easily formed, as a pixel electrode. Thus, the metal film 421 may be formed to cover the transparent conductive film 415 located over the surface having level difference. Accordingly, the transparent conductive film 415 over the surface having level difference is not etched nor disconnected.

In order to cover the transparent conductive film 415 over the surface having level difference with the metal film 421, it is necessary to satisfy at least d1>d2 when, in FIG. 5B, a thickness of the region 423 of the resist pattern 414a is denoted by d2 and a thinnest thickness in the region 422 is denoted by d1. The reason is as follows: Although a thickness of the entire resist is thinned by d2 by ashing of the thickness d2 in conducting ashing to the resist in FIG. 6A, it is necessary that a resist remains in the region 422 even if the thickness is thinned by d2 by the ashing. Therefore, it is preferable that the thickness d1 of a portion having a thinnest thickness of the region 422 be thicker than the thickness d2 of the region 423 at least in the resist pattern 414a.

In accordance with the above steps, a bottom-gate TFT having an island-like semiconductor film formed of an amorphous semiconductor film can be formed. By stacking the metal film, resistance can be lowered and conductivity can be enhanced while the transparent conductive film is utilized as the wiring or the electrode. Further, the number of steps can be reduced because a resist pattern for forming the metal film 421 is not required to be specially provided.

Figure 9A:
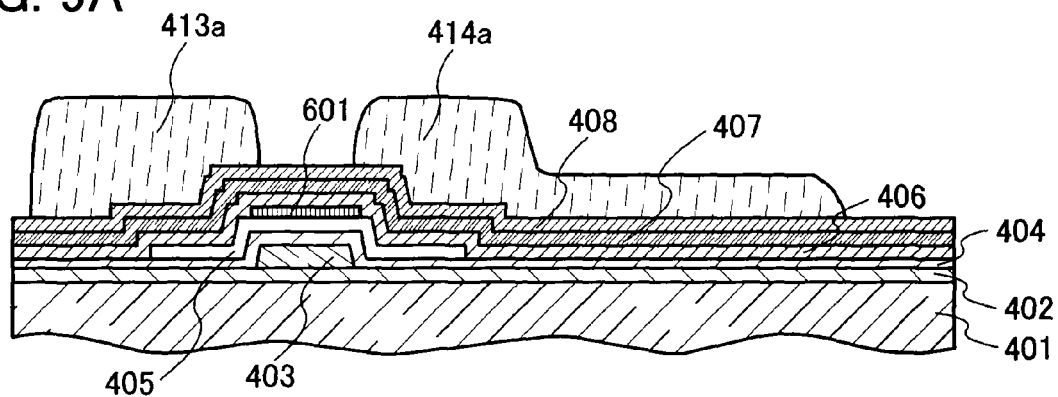
FIGS. 9A to 9D are cross-sectional views each showing a manufacturing process of a semiconductor device (Embodiment Mode 2)

FIG. 9A shows a TFT structure having a channel protective film as another TFT structure of this embodiment mode. In the TFT in FIG. 9A, the same portions as in FIGS. 5A to 5C, FIGS. 6A to 6C, and FIGS. 7 and 8 are denoted by the same reference numerals and detailed explanation will be omitted.

Steps up to the formation of an island-like semiconductor film 405 over a substrate 401 are the same as in FIG. 5A. Next, an insulating film such as a silicon nitride film is formed and a shape of the insulating film is processed by etching to form a channel protective film 601 near the center over the island-like semiconductor film 405. Thereafter, a conductive layer 406, a transparent conductive film 407, and a metal film 408 are sequentially formed so as to cover the channel protective film 601. The entire surface of the metal film 408 is coated with a resist film. After exposing the resist film using an exposure mask having a semi light-transmitting portion, developing is conducted to form resist patterns 413a and 414a.

Figure 9B:
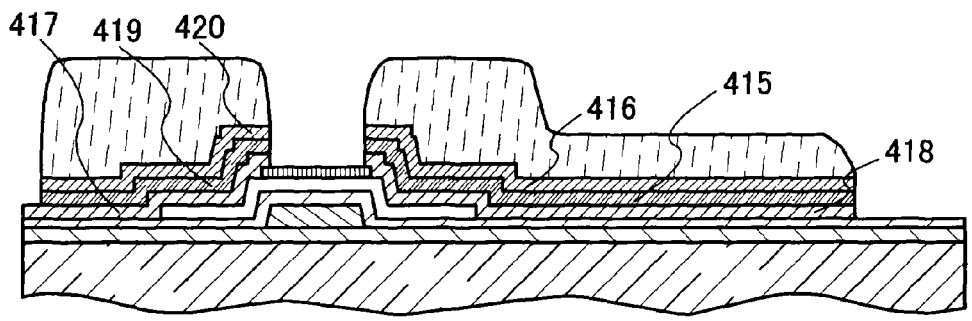

Next, etching is conducted by dry etching using the resist patterns 413a and 414a to form conductive layers 417 and 418, transparent conductive films 415 and 419, and metal films 416 and 420. The transparent conductive film 415 serves as a pixel electrode (FIG. 9B). The channel protective film 601 is to be a protective film for preventing the island-like semiconductor film 405 from being etched in forming the conductive layers 417 and 418.

Figure 9C:
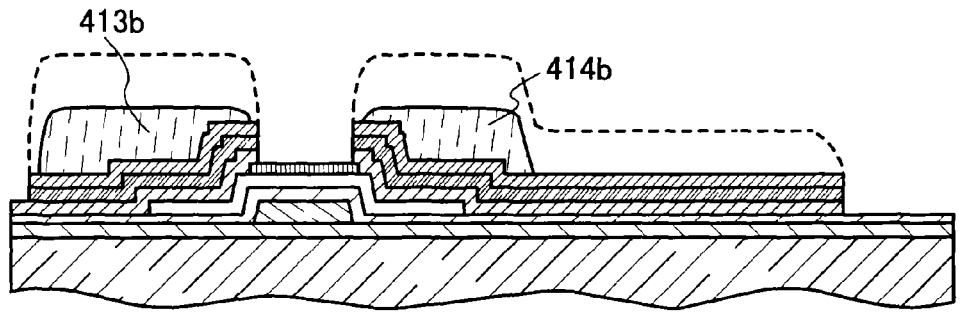
Figure 9D:
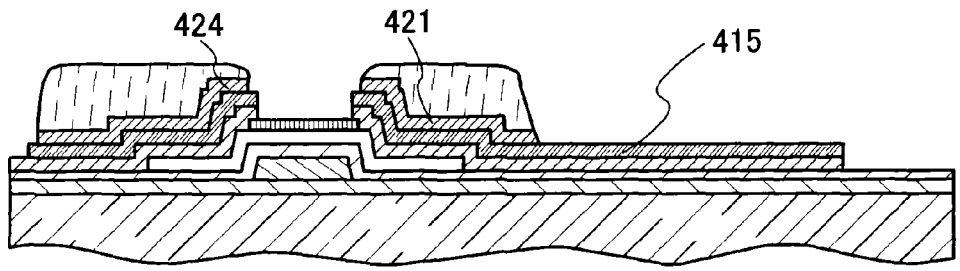

Next, ashing of the resist patterns 413a and 414a is conducted to form resist patterns 413b and 414b (FIG. 9C). The metal films 420 and 416 are etched using the resist patterns 413b and 414b to form metal films 424 and 421 (FIG. 9D). FIG. 9D shows a case where the metal films 424 and 421 are formed by dry etching. It is to be noted that the metal films 425 and 426 shown in FIG. 8 may be formed by wet etching. Shapes of edge portions of the metal film and the transparent conductive film at the time are similar to that explained in FIG. 8.

The TFT structure having the channel protective film 601 has the following effect. First, there is no concern that the island-like semiconductor film is etched in conducting dry etching in an etching step of the transparent conductive film 407 and the metal film 408 shown in FIG. 9B. Therefore, freedom degree of the etching step of the transparent conductive film and the metal film is enhanced and etching can be conducted under an ideal etching condition. Further, microfabrication can be conducted by dry etching. Furthermore, the island-like semiconductor film 405 can be formed to be thin and TFT characteristics can be improved. Therefore, the TFT structure is ideal for an active matrix organic light emitting diode which requires a TFT feeding a large amount of current to a driving TFT.

Figure 10:
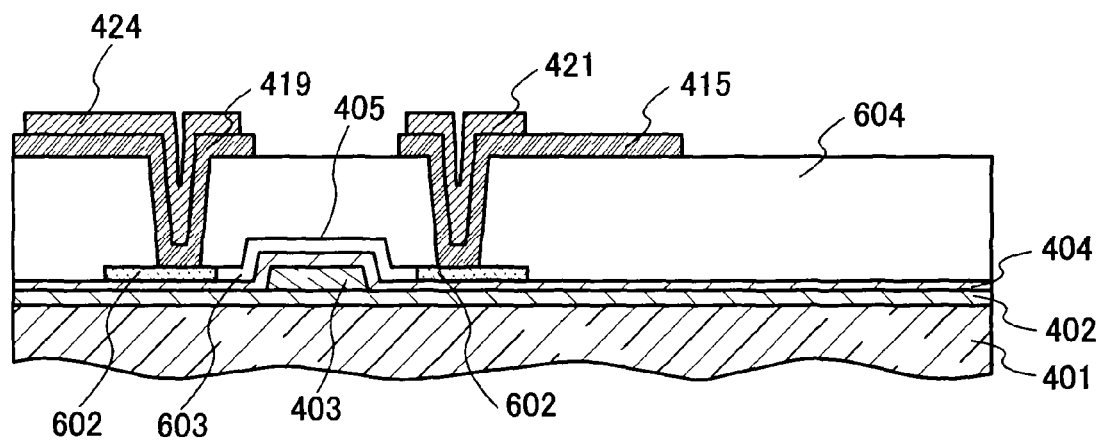
FIG. 10 is a cross-sectional view of a semiconductor device (Embodiment Mode 2)

FIG. 10 shows another TFT structure. The structure is a bottom-gate TFT formed using a crystalline semiconductor film. Steps up to the formation of a gate insulating film 404 over a substrate 401 are the same as FIG. 5A. Then, a crystalline semiconductor film is formed over the gate insulating film. The crystalline semiconductor film may be directly formed over the gate insulating film, or the crystalline semiconductor film may be formed by forming and then crystallizing an amorphous semiconductor film as in Embodiment Mode 1. A shape of the crystalline semiconductor film is processed by etching to form an island-like semiconductor film 405. The island-like semiconductor film 405 is selectively doped with an impurity to form a pair of impurity regions 602 and a channel formation region 603 in the island-like semiconductor film 405. After forming an interlayer insulating film 604 over the island-like semiconductor film 405, a contact hole reaching the impurity region 602 is formed in the interlayer insulating layer 604, and a transparent conductive film and a metal film are stacked. The metal film is stacked over the transparent conductive film. Then, etching is conducted using the resist pattern, which is exposed using the exposure mask shown in FIG. 5A and developed, to form an electrode or a wiring formed of the transparent conductive film 419 and the metal film 424, and an electrode or a wiring formed of the metal film 421 and the transparent conductive film 415. If the interlayer insulating film 604 is formed from an organic resin material or the like in the structure of FIG. 10, the interlayer insulating film 604 has a plane surface. In other words, the transparent conductive film 415 can be formed over the plane surface, and accordingly, disconnection of the transparent conductive film 415 in etching for forming the metal film 421 can be prevented.

It is to be noted that the TFT shown in FIG. 10 may have an impurity region other than the pair of impurity regions 602.

In FIGS. 9A to 9D and FIG. 10, a feature of a shape of the metal film due to an etching method for forming the metal films 421 and 424 is the same as that described above. Instead of the metal films 421 and 424, the metal films 425 and 426 each having a shape as in FIG. 8 can be formed by wet etching, or a metal film having a stacked structure may be used. Although the transparent conductive film is used as a conductive film serving as a pixel electrode, a reflective type conductive film may be used. As a material for the transparent conductive film, the material shown in Embodiment Mode 1 can be used.

This embodiment mode can be freely combined with Embodiment Mode 1 within the range of enablement.

Embodiment Mode 3

In this embodiment mode, an exposure mask used in Embodiment Modes 1 and 2 will be explained with reference to FIGS. 11A to 11D. FIGS. 11A to 11C each show a top view of the light-shielding portion 12b and the semi light-transmitting portion 13 of the exposure mask shown in FIG. 1A or FIG. 5A. A width of the light-shielding portion 12b of the exposure mask is denoted by t1, and a width of the semi light-transmitting portion 13 thereof is denoted by t2.

The semi light-transmitting portion 13 can be provided with a diffraction grating pattern, and FIGS. 11A and 11B each show a diffraction grating pattern having a slit portion including a plurality of slits at or below a resolution limit of an exposure apparatus. The diffraction grating pattern is a pattern in which at least one pattern such as a slit or a dot is arranged. In a case where a plurality of patterns such as a slit or a dot is arranged, the patterns may be arranged periodically or aperiodically. By using a minute pattern at or below a resolution limit, the substantial amount of exposure can be modulated and a thickness of an exposed resist after development can be adjusted.

The slit of the slit portion may be extended in a direction parallel to one side of a light-shielding portion 303 like a slit portion 301 or in a direction perpendicular to one side of the light-shielding portion 303 like a slit portion 302. Alternatively, the slit of the slit portion may be extended in an oblique direction with respect to one side of the light-shielding portion 303. It is to be noted that a resist to be used in this photolithography step is preferably a positive type resist.

In addition, as another example of the semi light-transmitting portion, FIG. 11C shows an example of providing a semi light-transmitting film 304 having a function of reducing light intensity of exposure light. As the semi light-transmitting film, MoSi, MoSiO, MoSiON, CrSi, or the like can be used as well as MoSiN. An exposure method using an exposure mask provided with a semi light-transmitting portion is also referred to as a half-tone exposure method.

When the exposure masks shown in FIGS. 11A to 11C are irradiated with exposure light, the light intensity is approximately zero in the light-shielding portion 303 and the light intensity is approximately 100% in a light-transmitting portion 305. On the other hand, the intensity of light passing through the semi light-transmitting portion having a light intensity reduction function formed of the slit portion 301 or 302 or the semi light-transmitting film 304, can be adjusted in the range of 10 to 70%. FIG. 11D shows a typical example of the light intensity distribution. In a case where the semi light-transmitting portion is a diffraction grating pattern, adjustment of the intensity of light passing through the semi light-transmitting portion can be realized by adjustment of the pitch and the slit width of the slit portions 301 and 302.

This embodiment mode can be freely combined with Embodiment Modes 1 and 2.

Embodiment Mode 4

In this embodiment mode, an EL (Electro Luminescence) display device will be explained with reference to FIGS. 12A and 12B and FIGS. 13A and 13B. As for a forming method, a material, and the like of a substrate and each layer which form a TFT, see Embodiment Modes 1 and 2. Although a TFT in FIGS. 12A and 12B and FIGS. 13A and 13B will be explained using a top-gate TFT structure of Embodiment Mode 1, a bottom-gate TFT structure may be used. The same portions as those in FIGS. 1A to 1C and FIGS. 2A to 2C in Embodiment Mode 1 are denoted by the same reference numerals and detailed explanation will be omitted. However, a pixel structure is not limited to ones in FIGS. 12A and 12B and FIGS. 13A and 13B, and another pixel structure may be used.

Figure 12A:
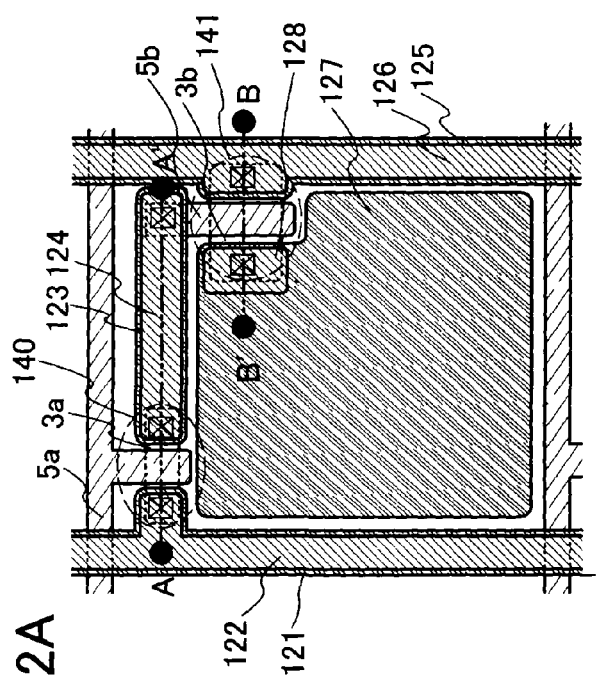
FIGS. 12A and 12B are a top view and a cross-sectional view of an EL display device (Embodiment Mode 4)
Figure 12B:
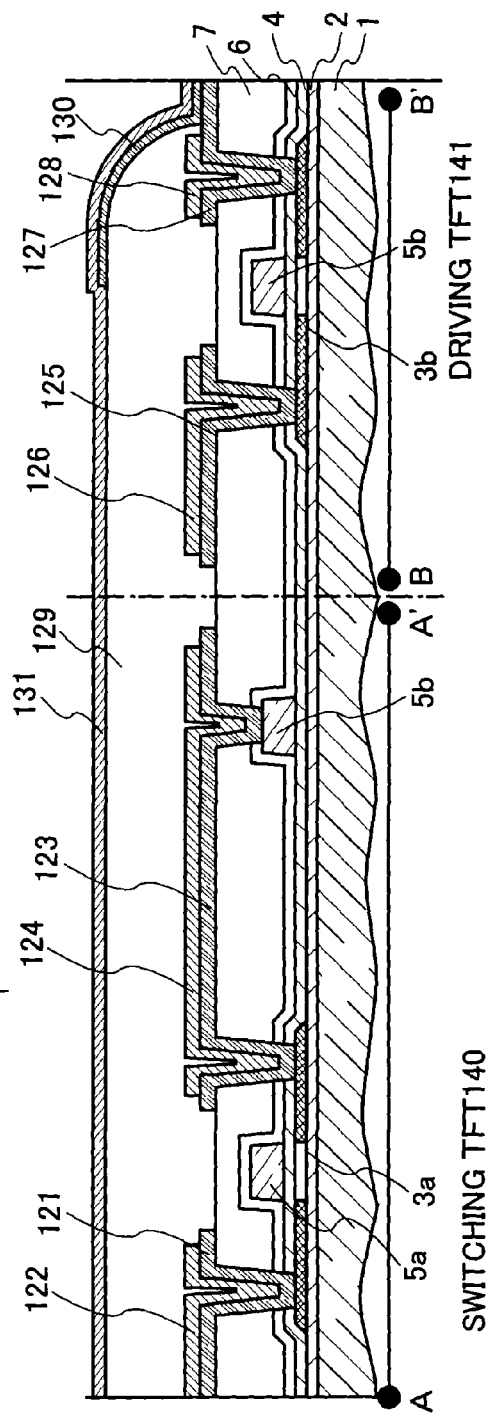

FIG. 12A shows a top view of a pixel portion of an EL display device. A pixel is provided with two TFTs of a switching TFT 140 and a driving TFT 141 for controlling current fed to an EL element. A gate electrode 5b of the driving TFT 141 is electrically connected to a transparent conductive film 123 and a metal film 124 to be a source electrode or a drain electrode of the switching TFT 140. FIG. 12B is a cross-sectional view taken along lines A-A' and B-B' in FIG. 12A.

The TFTs are formed over a substrate 1 by a method of Embodiment Mode 1. An insulating film 2 is formed over the substrate 1, and island-like semiconductor films 3a and 3b are formed thereover. The island-like semiconductor films 3a and 3b are formed of an amorphous semiconductor film or a crystalline semiconductor film. Subsequently, a gate insulating film 4 and gate electrodes 5a and 5b are formed. The gate electrode 5a is extended from a gate wiring, and the gate electrode 5b is formed to be separated from the gate wiring (gate electrode 5a). The island-like semiconductor films 3a and 3b are doped with an impurity element using the gate electrodes 5a and 5b as masks to form a pair of impurity regions and a channel formation region in the respective island-like semiconductor films 3a and 3b. Then, a first interlayer insulating film 6 and a second interlayer insulating film 7 are formed over the gate electrodes 5a and 5b.

Next, the gate insulating film 4, the first interlayer insulating film 6, and the second interlayer insulating film 7 are etched to form a contact hole reaching the pair of impurity regions in the island-like semiconductor film. At the same time, the first interlayer insulating film 6 and the second interlayer insulating film 7 are etched to form a contact hole reaching the gate electrode 5b. A transparent conductive film is formed over the second interlayer insulating film 7, and a metal film is stacked thereover. Then, the transparent conductive film and the metal film are etched by the same method as Embodiment Mode 1 to form a wiring or an electrode formed of a metal film 122 and a transparent conductive film 121, a wiring or an electrode formed of the metal film 124 and the transparent conductive film 123, a wiring or an electrode formed of a metal film 126 and a transparent conductive film 125, and a wiring or an electrode formed of a metal film 128 and a transparent conductive film 127. The transparent conductive film 127 serves as a pixel electrode.

The metal films 122, 124, and 126 are almost similar to the transparent conductive films 121, 123, and 125 located in the lower layer, respectively, and each have a pattern with a size smaller than the respective transparent conductive films. The metal films 122, 124 and 126 are formed by etching using a resist pattern which is exposed using an exposure mask having a light-shielding portion and developed like the resist pattern 16a shown in FIGS. 1A to 1C. On the other hand, part of the transparent conductive film 127 serves as a pixel electrode; therefore, the metal film 128 is not necessarily similar to the transparent conductive film 127 and has a smaller pattern than the transparent conductive film 127. Therefore, in order to form the transparent conductive film 127 and the metal film 128, etching is conducted using a resist pattern which is exposed using an exposure mask having a semi light-transmitting portion and a light-shielding portion and developed like the resist pattern 15a shown in FIGS. 1A to 1C.

After forming the metal films 122, 124, 126, and 128, residue of the metal film over the transparent conductive film may be removed by polishing the surface of a portion of the transparent conductive film 127 which is exposed from the metal film 128. The polishing can be conducted by a CMP (Chemical-Mechanical Polishing) method or the like. Since an electroluminescent layer, which is to be subsequently formed over the transparent conductive film 127, is extremely thin, the electroluminescent layer is not formed to be uniform due to residue of the metal film, and accordingly, short-circuit between the transparent conductive film 127 and a conductive layer 131 over the electroluminescent layer occurs. The polishing is effective in preventing this short-circuit.

Thereafter, an insulating film 129 to be an embankment (also referred to as a partition wall) is formed over the TFT. The insulating film 129 is formed so that a portion of the transparent conductive film 127 serving as the pixel electrode is exposed. Further, the insulating film 129 is formed to cover the metal film 128. This is for preventing cause of short-circuit failure of an EL element due to exposure of the metal film 128 from the insulating film 129. On the other hand, the insulating film 129 is formed to be continuously decreased in thickness and to have a curved surface near a portion where the transparent conductive film 127 is exposed. This is for preventing disconnection of the electroluminescent layer to be formed above in level difference of the insulating film 129. With such a shape of the insulating film 129 having a curved surface, there is a concern that an edge portion of the metal film 128 is easily exposed from the insulating film 129. However, the metal film 128 formed in accordance with the present invention has a structure not to be easily exposed from the insulating film 129 because an edge portion thereof is inclined or has an angle $\theta_2$ as explained in Embodiment Modes 1 and 2; therefore, it is very suitable for an EL display device.

In a case where the metal film 128 is formed by dry etching, a shape of a resist pattern to be formed above is reflected. In a cross-sectional view of FIG. 12B, the edge portion of the metal film 128 near the curved surface of the insulating film 129 is more inclined than the other edge portion. In a top view of FIG. 12A, two sides, which are farther from the edge portion of the transparent conductive film 127, are more inclined than the other two sides among the four sides of the metal film 128. On the other hand, in a case where the metal film 128 is formed by wet etching, the edge portion of the metal film 128 has an angle $\theta_2$, which is more acute than an angle $\theta_1$ in the edge portion of the transparent conductive film 127. Accordingly, the edge portion of the metal film 128 near the curved surface of the insulating film 129 is formed to have an incline or the angle $\theta_2$ by either forming method. Therefore, the metal film 128 has a shape which is not easily exposed from the insulating film 129.

Subsequently, an electroluminescent layer 130 is formed to be in contact with the transparent conductive film 127 exposed from the insulating film 129, and then, a conductive layer 131 is formed. In the above structure, if the TFT for driving a light emitting element is an n-channel TFT, the transparent conductive film 127 corresponds to a cathode, and the conductive layer 131 corresponds to an anode. When a transparent conductive film is used for the conductive layer 131, a display device which emits light both above and below is obtained.

Figure 13A:
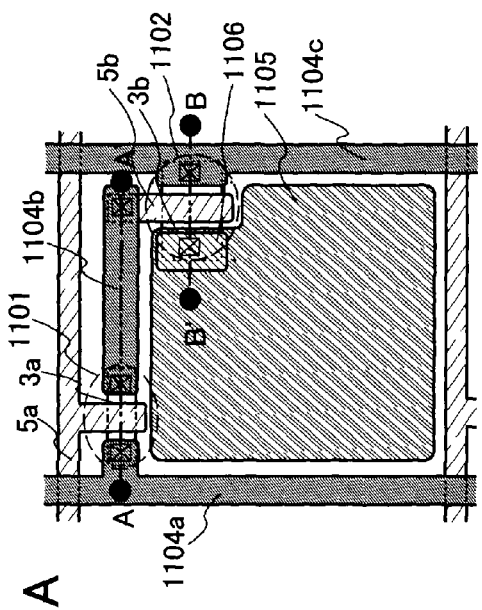
FIGS. 13A and 13B are a top view and a cross-sectional view of an EL display device (Embodiment Mode 4)
Figure 13B:
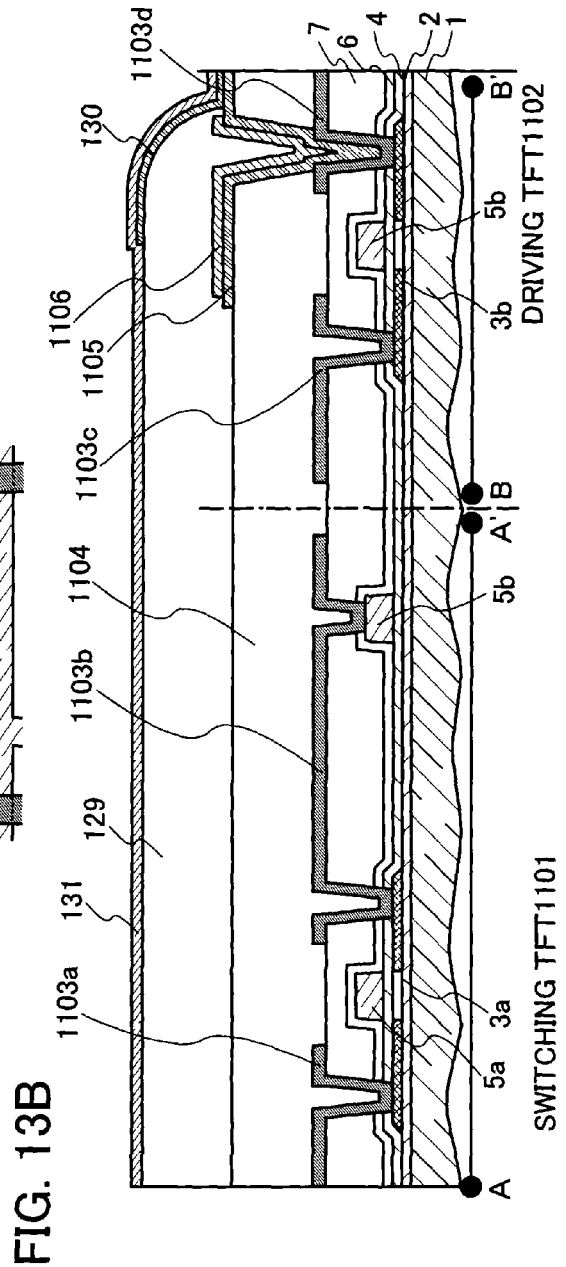

FIGS. 13A and 13B show an EL display device having a different structure from that of FIGS. 12A and 12B. FIG. 13A is a top view of a pixel portion of the EL display device, and FIG. 13B is a cross-sectional view taken along lines A-A' and B-B' in FIG. 13A.

Steps up to the formation of a contact hole reaching a pair of impurity regions of an island-like semiconductor film after forming a second interlayer insulating film 7 and conducting etching in FIG. 13B are the same as in FIG. 12B. A switching TFT 1101 and a driving TFT 1102 are formed. Then, a conductive layer is formed and etched to form wirings or electrodes 1103a to 1103d.

A third interlayer insulating film 1104 is formed over the wirings or electrodes 1103a to 1103d. The third interlayer insulating film 1104 is preferably formed of an organic resin film. In this manner, a transparent conductive film which is formed over the third interlayer insulating film 1104 and serves as a pixel electrode can be formed over a plane surface.

The third interlayer insulating film 1104 is etched to form a contact hole reaching the wiring or electrode 1103d. A transparent conductive film and a metal film are stacked over the third interlayer insulating film 1104 and etched to form a transparent conductive film 1105 and a metal film 1106. The transparent conductive film 1105 and the metal film 1106 are etched using a resist pattern which is exposed using an exposure mask having a semi light-transmitting portion and developed like the resist pattern 15a shown in FIGS. 1A to 1C. The transparent conductive film 1105 serves as the pixel electrode.

The contact hole formed in the second interlayer insulating film 7 and the contact hole formed in the third interlayer insulating film 1104 are favorably formed to overlap. The overlapping of the contact holes enables aperture ratio to be high. On the other hand, although a problem on disconnection of the transparent conductive film 1105 is caused by enlargement of level difference in the contact hole, the problem on disconnection can be compensated by making the metal film 1106 remain over the transparent conductive film 1105 in a contact hole portion.

After forming the metal film 1106, an insulating film 129, an electroluminescent layer 130, and a conductive layer 131 are formed in the same manner as FIG. 12B.

In this embodiment mode, although the conductive film to be used as a pixel electrode is formed of the transparent conductive film, a reflective type conductive film may also be used. As a material for the transparent conductive film, the material shown in Embodiment Mode 1 can be used. In addition, this embodiment mode can be freely combined with Embodiment Modes 1 to 3 within the range of enablement.

Embodiment Mode 5

In this embodiment mode, an example of a case where the present invention is applied to a liquid crystal display device will be explained.

Figure 14A:
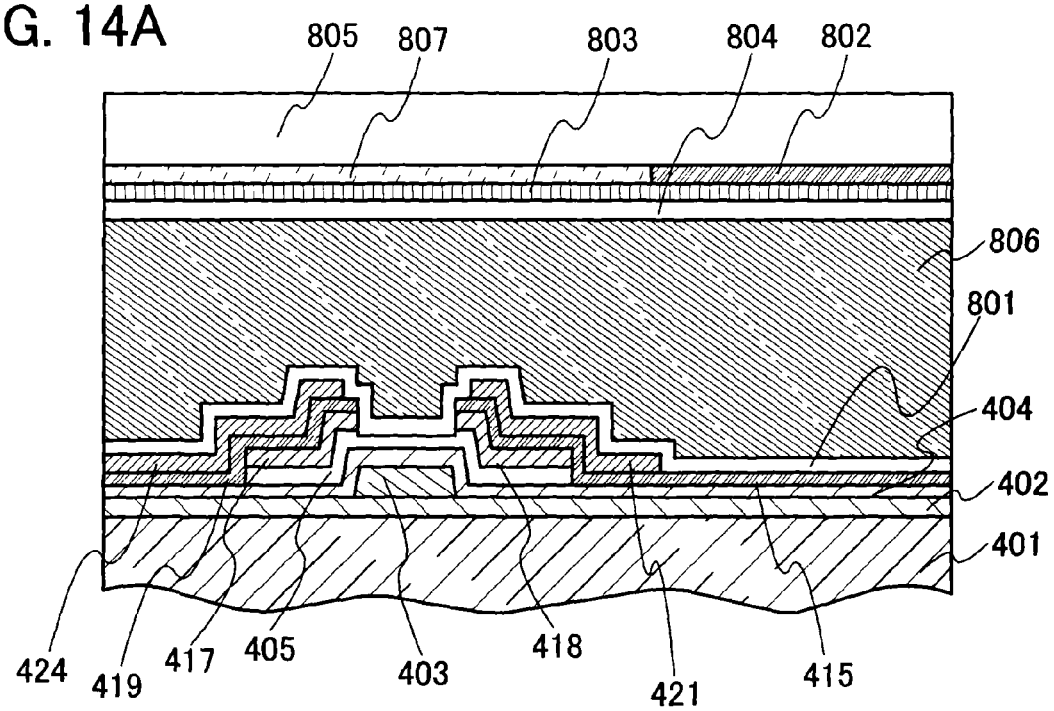
FIGS. 14A and 14B are a top view and a cross-sectional view of a liquid crystal display device (Embodiment Mode 5)

First, a manufacturing method of a liquid crystal display panel will be explained with reference to FIG. 14A. A bottom-gate TFT is formed over a substrate 401 in the same manner as FIG. 6C of Embodiment Mode 2. A TFT structure is not limited to the TFT shown in FIG. 6C of Embodiment Mode 2, and various kinds of TFT structures can be used.

After forming the TFT by the method of Embodiment Mode 3, an alignment film 801 is formed so as to cover metal films 424 and 421 and transparent conductive films 419 and 415. Then, a substrate 805 over which a color filter 802, a light-shielding film 807, an opposite electrode 803, and an alignment film 804 are formed is prepared, and the substrate 401 and the substrate 805 are attached to each other with a sealing material (not shown). The light-shielding film 807 is arranged so as to overlap with the TFT, and the color filter 802 is arranged so as to overlap with a portion of the transparent conductive film 415 serving as a pixel electrode. Thereafter, a liquid crystal 806 is injected. Thus, a display device provided with a display function is completed. Although not shown, a polarizing plate is attached to the substrates 401 and 805 on the opposite side of the liquid crystal 806. In accordance with the above steps, a liquid crystal display panel is completed. It is to be noted that a reflective type conductive film can be used in substitution for the transparent conductive film.

Figure 14B:
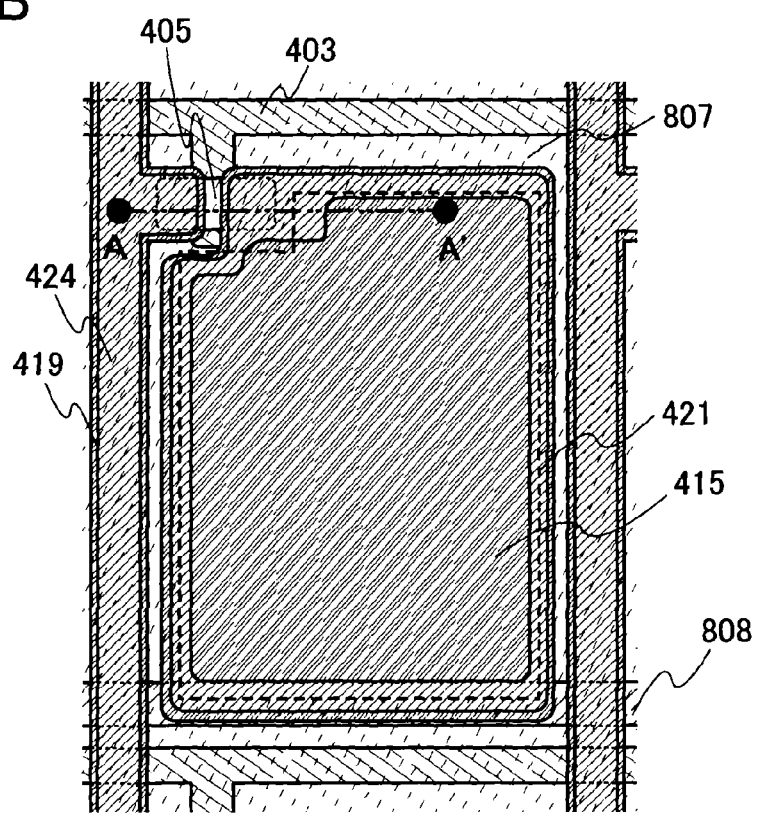

Next, in this embodiment mode, arrangement of the metal film formed over the transparent conductive film in a liquid crystal display device will be explained. FIG. 14B shows one example of a top view of a liquid crystal display device, and FIG. 14A is a cross-sectional view taken along a line A-A' of FIG. 14B. An island-like semiconductor film 405 overlaps a gate wiring 403, and a gate wiring portion which overlaps with the island-like semiconductor film 405 is to be a gate electrode. In other words, reference numeral 403 denotes a gate wiring and a gate electrode. Further, a stacked film of the metal film 424 and the transparent conductive film 419 to be a source wiring is electrically connected to the island-like semiconductor film 405 through a conductive layer 417, and a stacked film of the metal film 421 and the transparent conductive film 415 to be a drain wiring is electrically connected to the island-like semiconductor film 405 through a conductive layer 418. A capacitor wiring 808 forms a capacitor in a portion where the transparent conductive film 415 and the capacitor wiring 808 overlap. The capacitor wiring 808 may be formed of the same layer as the gate wiring 403 or may be formed of another layer. The light-shielding film 807 is indicated by a dashed line. The light-shielding film 807 overlaps with the source wiring, the drain wiring, and the TFT; however, the light-shielding film 807 does not overlap with a portion serving as a pixel electrode of the transparent conductive film 415.

The metal film 421 over the transparent conductive film 415 is formed along an edge of the transparent conductive film 415. For details, a side of the metal film 421 is formed along a side of the transparent conductive film 415. However, the side of the metal film 421 and the side of the transparent conductive film 415 do not coincide, and the side of the metal film 421 is located inside the side of the transparent conductive film 415. By forming the metal film 421 along the edge of the transparent conductive film 415 in this manner, arrangement accuracy of the light-shielding film 807 for light shielding between pixel electrodes can be lowered. This is because the metal film 421 serves as a light-shielding film even if misalignment of the light-shielding film 807 is caused in some degree, and accordingly, misalignment of the light-shielding film 807 is acceptable within the range of existence of the metal film 421. In particular, in a case where the light-shielding film is provided for the opposite substrate like FIGS. 14A and 14B, high alignment accuracy is desired. Therefore, it is effective to form the metal film 421 over the transparent conductive film along an edge of the pixel electrode to certainly conduct light shielding between pixels.

Figure 15A:
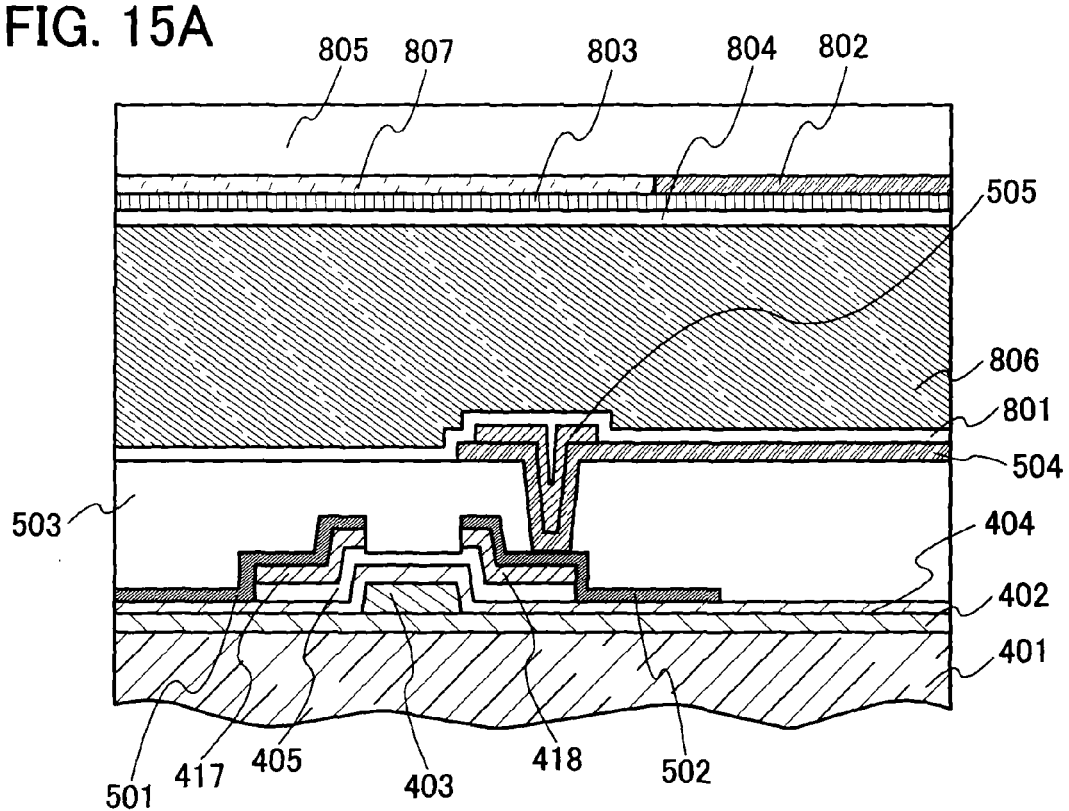
FIGS. 15A and 15B are a top view and a cross-sectional view of a liquid crystal display device (Embodiment Mode 5)
Figure 15B:
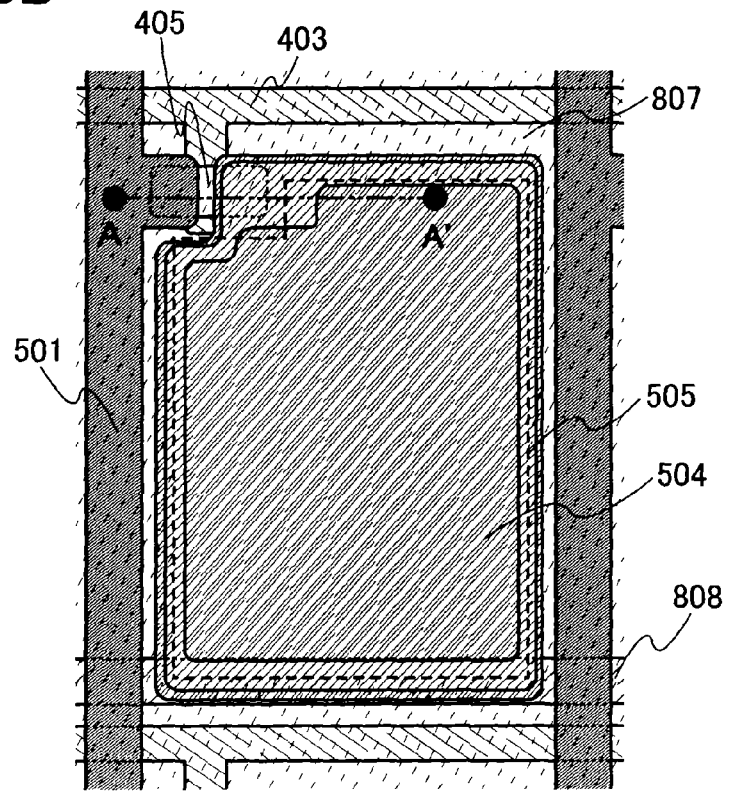

FIGS. 15A and 15B will be explained as another structure of a liquid crystal display device. FIGS. 15A and 15B show examples in which an interlayer insulating film is provided for the structure of FIGS. 14A and 14B. FIG. 15A is a cross-sectional view taken along a line A-A' of a top view of a liquid crystal display device shown in FIG. 15B. An island-like semiconductor film 405 overlaps a gate wiring 403, and a gate wiring portion which overlaps with the island-like semiconductor film 405 is to be a gate electrode. Further, a source wiring 501 is electrically connected to the island-like semiconductor film 405 through a conductive layer 417, and a drain wiring 502 is electrically connected to the island-like semiconductor film 405 through a conductive layer 418. A capacitor wiring 808 forms a capacitor in a portion where the transparent conductive film 504 and the capacitor wiring 808 overlap. The capacitor wiring 808 may be formed of the same layer as the gate wiring 403 or may be formed of another layer.

An interlayer insulating film 503 is formed over the source wiring 501 and the drain wiring 502, and a contact hole reaching the drain wiring 502 is formed in the interlayer insulating film 503. The interlayer insulating film 503 is an organic resin film or an inorganic insulating film. The transparent conductive film 504 and a metal film 505 are formed over the interlayer insulating film 503. In a case where the interlayer insulating film 503 is formed of an organic resin film, level difference due to the gate electrode 403 or the island-like semiconductor film 405 can be reduced; therefore, the transparent conductive film 504 serving as a pixel electrode can be formed over a plane surface. Accordingly, a pixel electrode can be enlarged more than the structure of FIGS. 14A and 14B, and aperture ratio can be improved.

The transparent conductive film 504 and the metal film 505 are formed by etching using a resist pattern which is exposed using an exposure mask having a light-shielding portion and developed like the resist pattern 16a shown in FIGS. 1A to 1C. A connection portion of the transparent conductive film 504 and the drain wiring 502 has large level difference, and there is a possibility that the transparent conductive film 504 is disconnected. Therefore, it is favorable that the metal film 505 be made to remain over the transparent conductive film 504.

Also in the top view of FIG. 15B, the metal film 505 is formed along an edge of the transparent conductive film 504 in the same manner as FIG. 14B, and can serve as part of a light-shielding film.

As the transparent conductive film 504, the material for the transparent conductive film shown in Embodiment Mode 1 can be used.

Figure 16A:
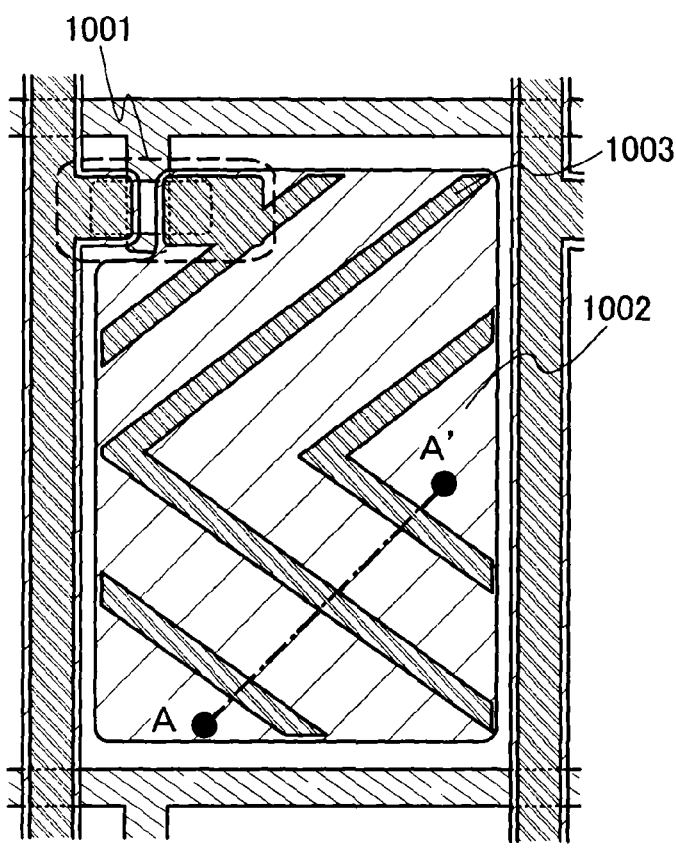
FIGS. 16A and 16B are a top view and a cross-sectional view of a liquid crystal display device (Embodiment Mode 5)
Figure 16B:
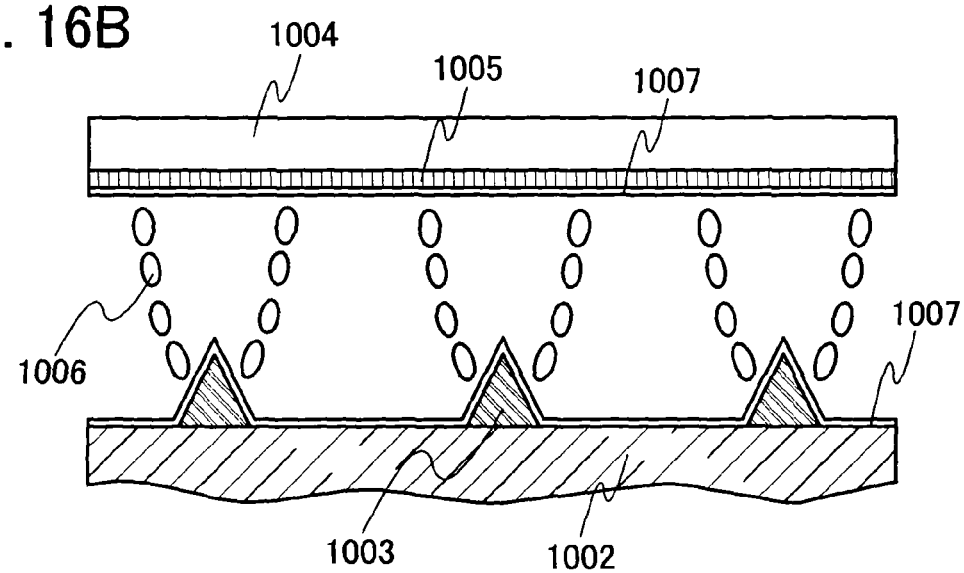

FIGS. 16A and 16B show an example of utilizing a metal film over a transparent conductive film for aligning liquid crystals in a plurality of directions. FIG. 16A is a top view of a pixel portion, and FIG. 16B is a cross-sectional view near a liquid crystal layer taken along a line A-A' in FIG. 16A. One pixel includes a TFT 1001, a transparent conductive film 1002 serving as a pixel electrode, and a metal film 1003 formed thereover. Reference numeral 1004 denotes an opposite substrate; 1005, an opposite electrode; 1006, a liquid crystal; and 1007, an alignment film. A plurality of the metal films 1003 is arranged over one transparent conductive film 1002. A cross-sectional shape of each metal film 1003 is a triangular shape, and liquid crystals in one pixel are aligned in two directions by an inclined surface thereof. Each metal film is formed to make a ridge over the transparent conductive film 1002. Such a structure is referred to as a so-called MVA (Multi-domain Vertical Alignment) method, and wide viewing angle characteristics can be obtained. Although a cross section of the metal film 1003 has a triangular shape in the cross-sectional view of FIG. 16B, a trapezoidal shape may be employed. Also in the case, liquid crystals in one pixel can be aligned in two directions by an inclined surface thereof.

Figure 17A:
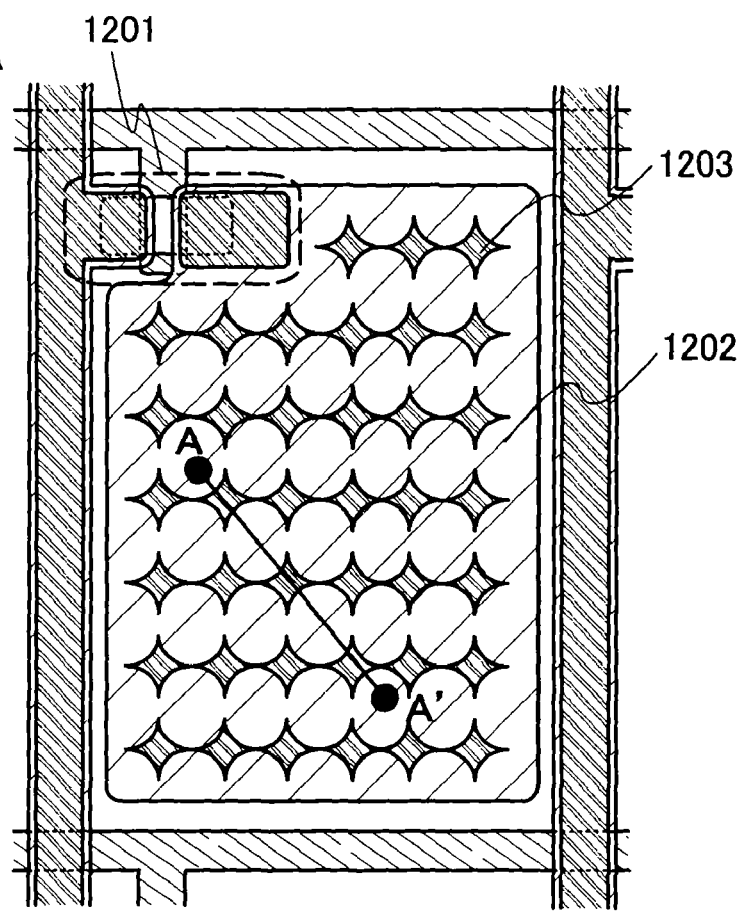
FIGS. 17A and 17B are a top view and a cross-sectional view of a liquid crystal display device (Embodiment Mode 5)
Figure 17B:
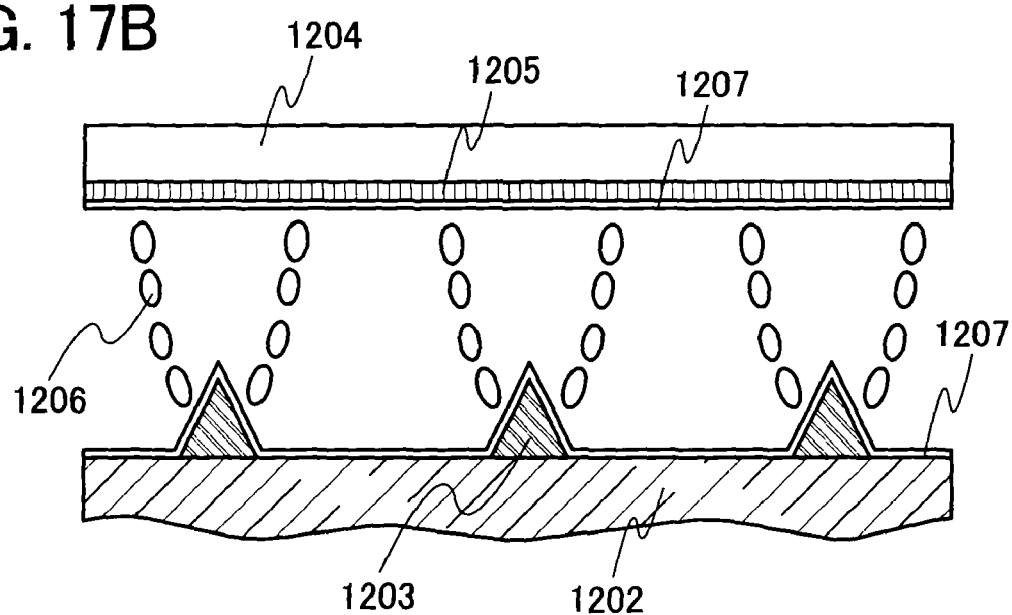

FIGS. 17A and 17B show another arrangement example of a metal film by a MVA method. FIG. 17A is a top view of a pixel portion, and FIG. 17B is a cross-sectional view near a liquid crystal layer taken along a line A-A' in FIG. 17A. One pixel includes a TFT 1201, a transparent conductive film 1202 serving as a pixel electrode, and a metal film 1203 formed thereover. Reference numeral 1204 denotes an opposite substrate; 1205, an opposite electrode; 1206, a liquid crystal; and 1207, an alignment film. In FIGS. 17A and 17B, the metal film 1203 forms a plurality of projections and each projection has a peak and has a shape like a quadrangular pyramid. Therefore, liquid crystals in one pixel are aligned by the number of inclined surfaces of the projection, namely in four directions. The shape of the projection may be a triangular pyramid or the like other than a quadrangular pyramid, and in that case, liquid crystals are aligned in three directions. Therefore, with the structure of FIGS. 17A and 17B, wider viewing angle characteristics than FIGS. 16A and 16B can be obtained.

The example explained in this embodiment mode can be utilized as a substitute for a slit for giving a specific alignment to a liquid crystal of a PVA (Patterned Vertical Alignment) method or the like. By using the example in substitution for a slit of a PVA method, a step of forming a slit in a transparent conductive film to be a pixel electrode can be reduced.

Figure 18:
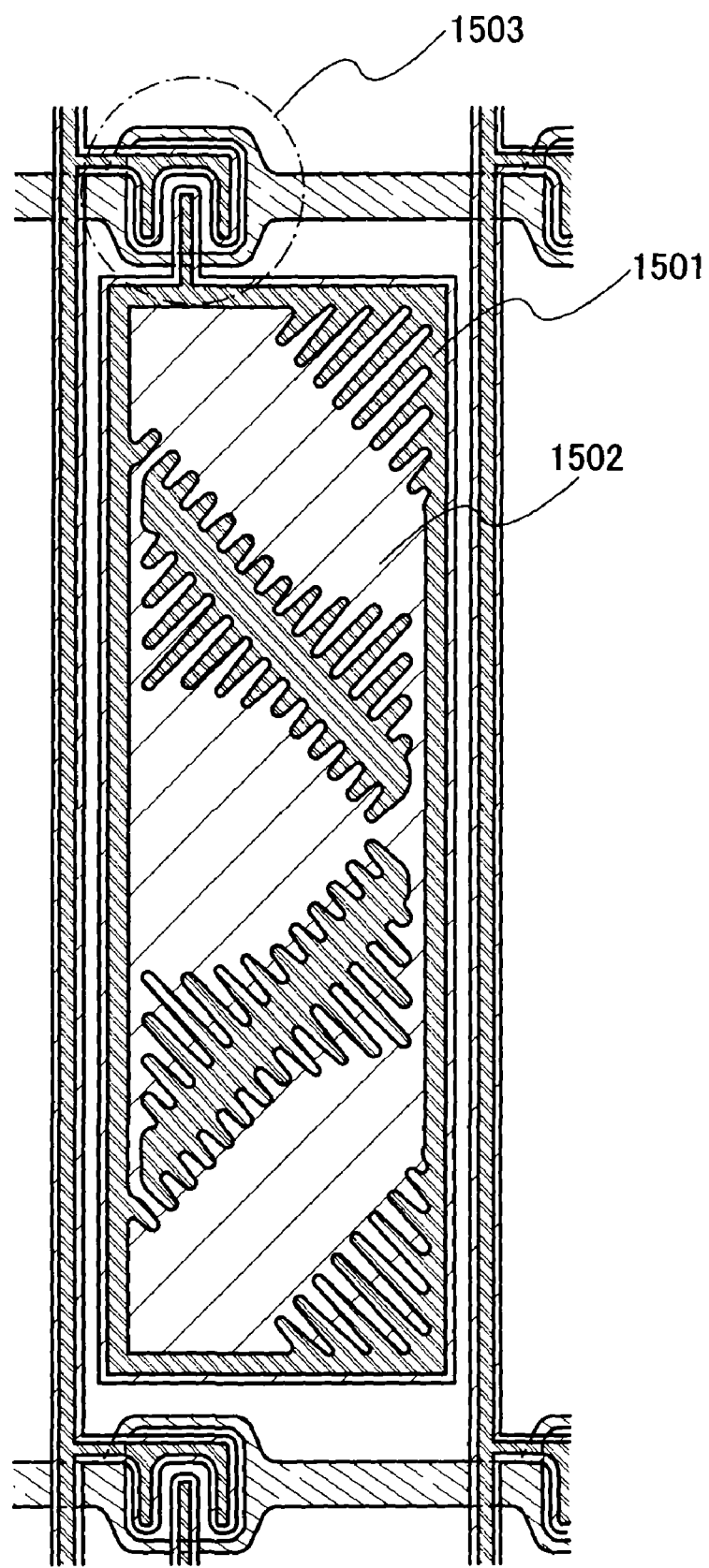
FIG. 18 is a top view of a liquid crystal display device (Embodiment Mode 5)

In addition, FIG. 18 shows another arrangement example of a metal film. A transparent conductive film 1502 serving as a pixel electrode is electrically connected to a TFT 1503, and further, a metal film 1501 is stacked over the transparent conductive film 1502. The metal film 1501 has a comb shape.

As described above, by an ingenuity of arrangement of a metal film over a transparent conductive film, light shielding can be certainly conducted and viewing angle characteristics can be improved. In addition, the number of forming steps can be reduced because a special mask for forming a metal film is not necessarily formed.

It is to be noted that each TFT shown in FIGS. 13A and 13B, FIGS. 14A and 14B, FIGS. 15A and 15B, FIGS. 16A and 16B, FIGS. 17A and 17B, and FIG. 18 has a bottom-gate structure; however, the structure is just one example, and another TFT structure can be used. In addition, this embodiment mode can be freely combined with Embodiment Modes 1 to 4 within the range of enablement.

Embodiment Mode 6

As semiconductor devices according to the present invention, cameras such as video cameras or digital cameras, goggle-type displays (head mounted displays), navigation systems, audio reproducing devices (such as car audio components or audio components), personal computers, game machines, mobile information terminals (mobile computers, cellular phones, mobile game machines, electronic books, and the like), image reproducing devices provided with a recording medium (specifically, devices provided with a display which can reproduce a recording medium such as a Digital Versatile Disk (DVD) and can display the image), and the like can be given. FIGS. 20A to 20D and FIG. 21 show specific examples of the semiconductor devices.

Figure 20A:
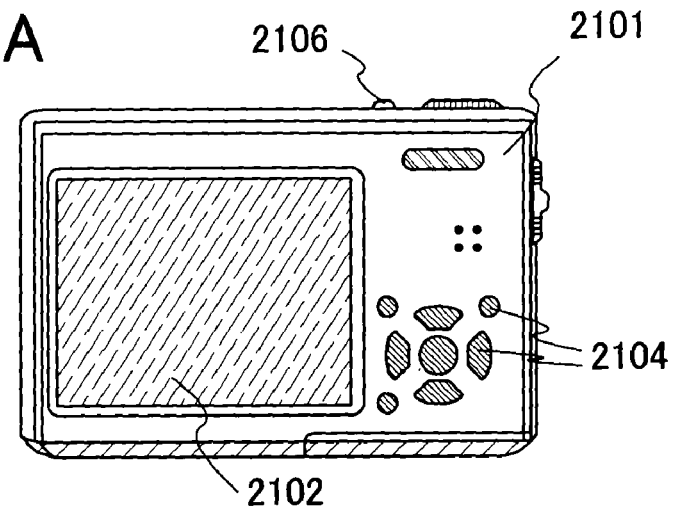
FIGS. 20A to 20D are views of electronic devices (Embodiment Mode 6)

FIG. 20A shows a digital camera, which includes a main body 2101, a display portion 2102, an imaging portion, operation keys 2104, a shutter 2106, and the like. FIG. 20A shows the digital camera seen from the display portion 2102 side, and the imaging portion is not shown in FIG. 20A. In accordance with the present invention, an inexpensive and highly reliable digital camera with less display failure can be realized.

Figure 20B:
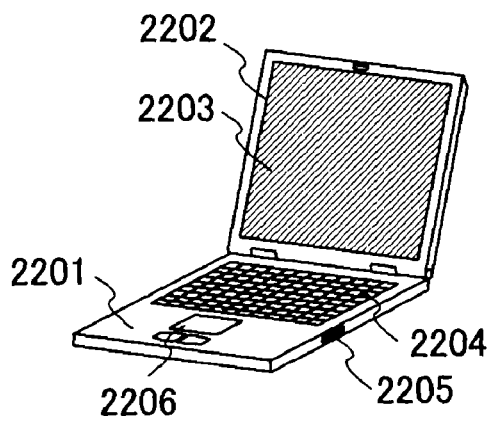

FIG. 20B shows a personal computer including a main body 2201, a casing 2202, a display portion 2203, a keyboard 2204, an external connection port 2205, a pointing mouse 2206, and the like. In accordance with the present invention, an inexpensive and highly reliable personal computer with less display failure can be realized.

Figure 20C:
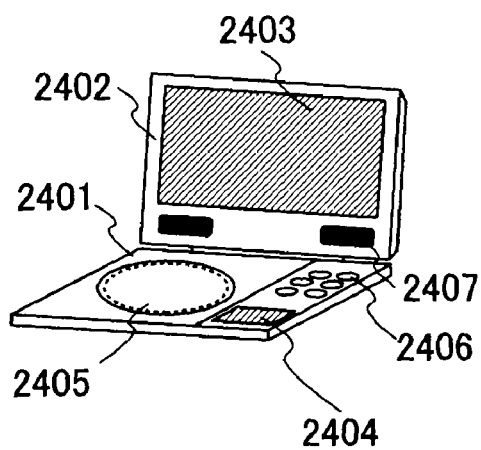

FIG. 20C shows a portable image reproducing device provided with a recording medium (specifically, a DVD reproducing device), which includes a main body 2401, a casing 2402, a display portion A 2403, a display portion B 2404, a recording medium (such as a DVD) reading portion 2405, operation keys 2406, a speaker portion 2407, and the like. The display portion A 2403 mainly displays image information and the display portion B 2404 mainly displays character information. The category of such an image reproducing device provided with a recording medium includes a home game machine and so on. In accordance with the present invention, an inexpensive and highly reliable image reproducing device with less display failure can be realized.

Figure 20D:
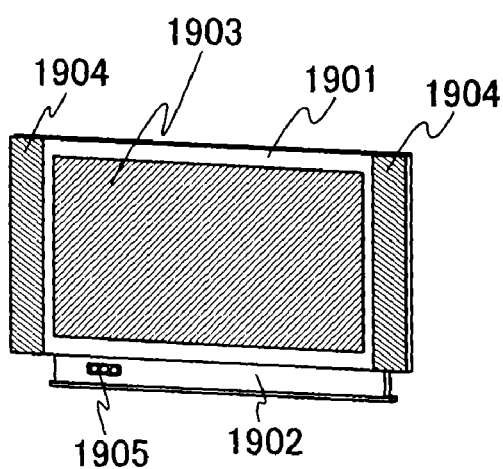

FIG. 20D shows a display device which includes a casing 1901, a support 1902, a display portion 1903, a speaker 1904, a video input terminal 1905, and the like. This display device is manufactured by using a thin film transistor formed by a manufacturing method described in Embodiment Modes described above for the display portion 1903 and a driver circuit. Liquid crystal display devices, light-emitting devices, and the like are given as examples of display devices. Specifically, all types of display devices for displaying information are included, for example, display devices for computers, display devices for receiving television broadcasting, and display devices for advertisement. In accordance with the present invention, an inexpensive and highly reliable display device with less display failure, in particular, a large-sized display device having a large screen of 22 to 50 inches, can be realized.

Figure 21:
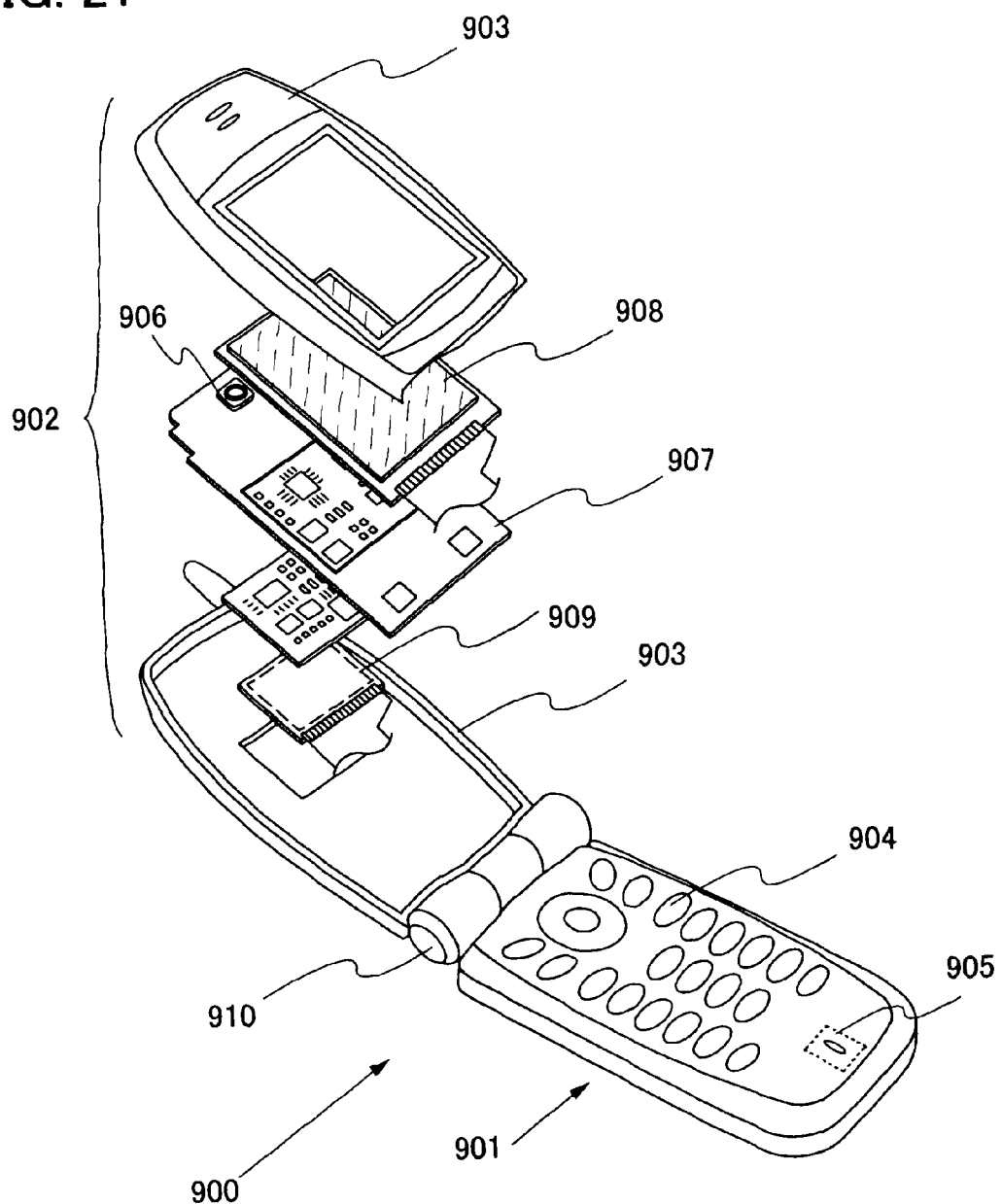
FIG. 21 is a view of a cellular phone (Embodiment Mode 6).

In the cellular phone 900 shown in FIG. 21, a main body (A) 901 provided with operation switches 904, a microphone 905, and the like is connected with a hinge 910 to a main body (B) 902 provided with a display panel (A) 908, a display panel (B) 909, a speaker 906, and the like, and it is openable and closable by the hinge 910. The display panel (A) 908 and the display panel (B) 909 are placed in a casing 903 of the main body (B) 902 together with a circuit board 907. Pixel portions of the display panel (A) 908 and the display panel (B) 909 are arranged such that they are visible through an opening formed in the casing 903.

As for the display panel (A) 908 and the display panel (B) 909, the specifications such as the number of pixels can be appropriately determined in accordance with the functions of the cellular phone 900. For example, the display panel (A) 908 and the display panel (B) 909 can be combined as a main screen and a sub-screen, respectively.

In accordance with the present invention, an inexpensive and highly reliable mobile information terminal with less display failure can be realized.

The cellular phone according to this embodiment mode can be changed in various modes depending on functions or applications thereof. For example, it may be a camera-equipped cellular phone by implementing an imaging element in the hinge 910. Even when the operation switches 904, the display panel (A) 908, and the display panel (B) 909 are placed in one casing, the above-described effect can be obtained. Further, a similar effect can be obtained even when the structure of this embodiment mode is applied to an information display terminal equipped with a plurality of display portions.

As described above, various types of electronic devices can be completed by using any structures or manufacturing methods of Embodiment Modes 1 to 8 as the display portion in FIGS. 20A to 20D or the display panel in FIG. 21.

According to the present invention, a conductive film serving as a pixel electrode and a metal film stacked thereover can be formed using one mask. Further, when the conductive film is disconnected due to level difference, the disconnected conductive films can be connected to each other with the metal film. In accordance with the above, an inexpensive semiconductor device can be manufactured through fewer manufacturing steps and a highly reliable semiconductor device can be realized.

This application is based on Japanese Patent Application serial No. 2005-301022 filed in Japan Patent Office on Oct. 14, 2005, the entire contents of which are hereby incorporated by reference.

What is claimed is:

1. A display device comprising:
a gate electrode formed over a substrate;
a gate insulating film formed over the gate electrode;
an island-like semiconductor film on the gate insulating film;
a conductive layer formed on the island-like semiconductor film;
a pixel electrode formed on the conductive layer; and
a metal film formed on the pixel electrode,
wherein the pixel electrode is in direct contact with a side surface of the conductive layer,
the pixel electrode is in direct contact with the island-like semiconductor film,
the pixel electrode has a level difference portion, and the metal film is in direct contact with the pixel electrode so as to cover the level difference portion of the pixel electrode, and
the level difference portion of the pixel electrode overlaps with the island-like semiconductor film.

2. The display device according to claim 1, wherein the conductive layer comprises an amorphous silicon film including phosphorus.

3. The display device according to claim 2, wherein a first thickness is thicker than a second thickness when the first thickness of a portion in contact with the metal film and the second thickness of a portion not in contact with the metal film in the pixel electrode are compared with each other.

4. The display device according to claim 1, wherein a first thickness is thicker than a second thickness when the first thickness of a portion in contact with the metal film and the second thickness of a portion not in contact with the metal film in the pixel electrode are compared with each other.

5. A display device comprising:
a thin film transistor over a substrate;
a pixel electrode electrically connected to the thin film transistor; and
a metal film formed over the pixel electrode,
wherein the thin film transistor has an island-like semiconductor film over a gate electrode through a gate insulating film,
the pixel electrode is electrically connected to the island-like semiconductor film through a conductive layer,
the pixel electrode is in direct contact with the gate insulating film,
the pixel electrode has a level difference portion, and the metal film is in direct contact with the pixel electrode so as to cover the level difference portion of the pixel electrode, and
the level difference portion of the pixel electrode is in a portion of the pixel electrode which overlaps with the island-like semiconductor film.

6. The display device according to claim 5, further comprising an interlayer insulating film which is formed over the thin film transistor and has a contact hole.

7. The display device according to claim 5, wherein a first thickness is thicker than a second thickness when the first thickness of a portion in contact with the metal film and the second thickness of a portion not in contact with the metal film in the pixel electrode are compared with each other.

8. A display device comprising:
a thin film transistor over a substrate;
an interlayer insulating film comprising an organic resin material, which is formed over the thin film transistor and has a contact hole overlapping with the thin film transistor;
a pixel electrode electrically connected to the thin film transistor through the contact hole; and
a metal film formed over the pixel electrode,
wherein the pixel electrode has a level difference portion due to the existence of the contact hole, and the metal film is in direct contact with the pixel electrode so as to cover the level difference portion of the pixel electrode.

9. The display device according to claim 8, wherein a first thickness is thicker than a second thickness when the first thickness of a portion in contact with the metal film and the second thickness of a portion not in contact with the metal film in the pixel electrode are compared with each other.

10. A display device comprising:
a thin film transistor over a substrate;
a pixel electrode electrically connected to the thin film transistor; and
a metal film formed over the pixel electrode to be in contact therewith,
wherein the metal film has a smaller plane-surface area than the pixel electrode,
a side of the metal film is along a side of the pixel electrode, and
the side of the metal film is located inside the side of the pixel electrode.

11. The display device according to claim 10, wherein the metal film is a light-shielding film.

12. The display device according to claim 10, wherein a first thickness is thicker than a second thickness when the first thickness of a portion in contact with the metal film and the second thickness of a portion not in contact with the metal film in the pixel electrode are compared with each other.

13. A display device comprising:
a thin film transistor over a substrate;
a pixel electrode electrically connected to the thin film transistor;
a metal film formed over the pixel electrode to be in contact therewith;
a partition wall which is formed over the pixel electrode and the metal film and makes part of the pixel electrode be exposed;
an electroluminescent layer formed to be in contact with the partition wall and the pixel electrode; and
an electrode over the electroluminescent layer,
wherein at least one side of the metal film is inclined and covered with the partition wall.

14. The display device according to claim 13, wherein a first thickness is thicker than a second thickness when the first thickness of a portion in contact with the metal film and the second thickness of a portion not in contact with the metal film in the pixel electrode are compared with each other.

* * * * *